United States Patent
Park et al.

(10) Patent No.: US 10,622,217 B2
(45) Date of Patent: Apr. 14, 2020

(54) METHOD OF PLASMA ETCHING AND METHOD OF FABRICATING SEMICONDUCTOR DEVICE USING THE SAME

(71) Applicant: Samsung Electronics Co., Ltd., Suwon-si, Gyeonggi-do (KR)

(72) Inventors: Hoyong Park, Hwaseong-si (KR); Namjun Kang, Bucheon-si (KR); Dougyong Sung, Seoul (KR); Seungbo Shim, Seoul (KR); Junghyun Cho, Suwon-si (KR); Myungsun Choi, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/423,003

(22) Filed: Feb. 2, 2017

(65) Prior Publication Data

US 2017/0229312 A1 Aug. 10, 2017

(30) Foreign Application Priority Data

Feb. 4, 2016 (KR) .................. 10-2016-0014323
Nov. 8, 2016 (KR) .................. 10-2016-0148298

(51) Int. Cl.
*H01L 21/3065* (2006.01)
*H01L 21/67* (2006.01)
(Continued)

(52) U.S. Cl.
CPC .... *H01L 21/3065* (2013.01); *H01J 37/32082* (2013.01); *H01J 37/32091* (2013.01);
(Continued)

(58) Field of Classification Search
None
See application file for complete search history.

(56) References Cited

U.S. PATENT DOCUMENTS 6,849,154 B2 2/2005 Nagahata et al.
7,169,256 B2 1/2007 Dhindsa et al.
(Continued)

FOREIGN PATENT DOCUMENTS

JP 5764186 B2 8/2015
KR 20080044657 A 5/2008
KR 20130101492 A 9/2013

*Primary Examiner* — Allan W. Olsen
(74) *Attorney, Agent, or Firm* — Harness, Dickey & Pierce, P.L.C.

(57) ABSTRACT

Disclosed are a method of plasma etching and a method of fabricating a semiconductor device including the same. The method of plasma etching includes loading a substrate including an etch target onto a first electrode in a chamber, the chamber including the first electrode and a second electrode arranged to face each other, and etching the target. The etching the target includes applying a plurality of RF powers to one of the first and second electrodes. The plurality of RF powers may include a first RF power having a first frequency in a range from about 40 MHz to about 300 MHz, a second RF power having a second frequency in a range from about 100 kHz to about 10 MHz, and a third RF power having a third frequency in a range from about 10 kHz to about 5 MHz.

9 Claims, 41 Drawing Sheets

(51) Int. Cl.
  *H01L 21/311* (2006.01)
  *H01J 37/32* (2006.01)
  *H01L 27/11582* (2017.01)
  *H01L 49/02* (2006.01)

(52) U.S. Cl.
  CPC .. *H01J 37/32165* (2013.01); *H01J 37/32532* (2013.01); *H01L 21/31116* (2013.01); *H01L 21/67069* (2013.01); *H01J 2237/334* (2013.01); *H01L 27/11582* (2013.01); *H01L 28/90* (2013.01)

(56) References Cited

U.S. PATENT DOCUMENTS

| | | |
|---|---|---|
| 7,405,521 B2 | 7/2008 | Dhindsa et al. |
| 7,777,567 B2 | 8/2010 | Polizzo |
| 8,002,945 B2 * | 8/2011 | Shannon ........... H01J 37/32091 156/345.2 |
| 8,357,264 B2 | 1/2013 | Shannon et al. |
| 8,652,298 B2 | 2/2014 | Dhindsa et al. |
| 8,901,935 B2 | 12/2014 | Valcore, Jr. et al. |
| 9,114,666 B2 | 8/2015 | Valcore, Jr. et al. |
| 9,119,283 B2 | 8/2015 | Albarede |
| 9,804,233 B2 * | 10/2017 | Seo ..................... G01R 33/0286 |
| 9,872,373 B1 * | 1/2018 | Shimizu ................... H05H 1/46 |
| 2008/0119049 A1 | 5/2008 | Sung et al. |
| 2008/0149592 A1 | 6/2008 | Belen et al. |
| 2009/0295295 A1 * | 12/2009 | Shannon ........... H01J 37/32082 315/111.21 |
| 2010/0099266 A1 | 4/2010 | Oswald et al. |
| 2011/0031216 A1 * | 2/2011 | Liao ................. H01J 37/32082 216/67 |
| 2013/0126475 A1 * | 5/2013 | Dhindsa ............ H01J 37/32091 216/61 |
| 2014/0305905 A1 | 10/2014 | Yamada et al. |
| 2018/0033594 A1 * | 2/2018 | Gu .................... H01J 37/32091 |

* cited by examiner

METHOD OF PLASMA ETCHING AND METHOD OF FABRICATING SEMICONDUCTOR DEVICE USING THE SAME

CROSS-REFERENCE TO RELATED APPLICATIONS

This U.S. nonprovisional patent application claims priority under 35 U.S.C § 119 of Korean Patent Applications 10-2016-0014323 filed on Feb. 4, 2016 and 10-2016-0148298 filed Nov. 8, 2016, the entire contents of which are hereby incorporated by reference.

BACKGROUND

Inventive concepts relate to a method of plasma etching and a method of fabricating a semiconductor device using the same.

Semiconductor devices are widely used in an electronic industry due to theirs compact size, multifunction, and/or low manufacturing cost. The semiconductor devices are fabricated using various semiconductor manufacturing processes such as deposition processes, ion implantation processes, photolithography processes, and etching processes. Plasma may be used to perform some of the semiconductor fabricating processes. As the semiconductor devices have been highly integrated, the structures of the semiconductor devices have become more complicated. In particular, it has been recently developed semiconductor devices having more complicated structures. Accordingly, the semiconductor manufacturing processes are more complicated and thus increased fabrication time may be used to fabricate semiconductor devices.

SUMMARY

Some example embodiments of inventive concepts provide a method of plasma etching and a method of fabricating a semiconductor device using the same capable of easily forming a circuit pattern having a high aspect ratio.

Some example embodiments of inventive concepts provide a method of plasma etching and a method of fabricating a semiconductor device using the same capable of effectively controlling various process parameters.

According to some example embodiments of inventive concepts, a method of plasma etching may include: loading a substrate including an etch target onto a first electrode in a chamber, the chamber including the first electrode and a second electrode arranged to face each other; and etching the etch target. The etching the etching target includes supplying the first electrode with a plurality of RF powers having different frequencies from each other. The plurality of RF powers may include: a first RF power configured to generate a plasma within the chamber; a second RF power configured to equalize a density of the plasma within the chamber; a third RF power configured to make ions within the plasma incident on the substrate; and a fourth RF power configured to homogenize an ion energy distribution of the ions incident on the substrate.

According to some example embodiments of inventive concepts, a method of fabricating a semiconductor device may include: forming a mold insulation layer on a substrate; and performing on the mold insulation layer a plasma etching process to form an etched opening that penetrates at least a portion of the mold insulation layer. The performing the plasma etching process may include: loading the substrate on a first electrode in a chamber; and supplying the first electrode with a plurality of RF powers having different frequencies from each other. The plurality of RF powers may include: a first RF power configured to generate a plasma within the chamber; a second RF power configured to equalize a density of the plasma within the chamber; a third RF power configured to make ions within the plasma incident on the substrate; and a fourth RF power configured to homogenize an ion energy distribution of the ions incident on the substrate.

According to some example embodiments of inventive concepts, a method of plasma etching may include: loading in a substrate in a chamber, the substrate including an etching target; and etching the etching target. The etching the target includes applying a plurality of RF powers to one of the first and second electrodes. The plurality of RF powers may include a first RF power having a first frequency in a range from about 40 MHz to about 300 MHz; a second RF power having a second frequency in a range from about 100 kHz to about 10 MHz; and a third RF power having a third frequency in a range from about 10 kHz to about 5 MHz.

According to some example embodiments of inventive concepts, a method of plasma etching may include loading a substrate on a lower electrode in a chamber, the substrate including an etching target, the chamber including the lower electrode and an upper electrode facing the lower electrode; and generating plasma in the chamber to etch the etching target. Generating the plasma may include applying a first source RF power to one of the lower and upper electrodes, and after applying the first source RF power, applying a plurality of bias RF powers to the lower electrode. The plurality of bias RF powers may include a first bias RF power having a frequency in a range from about 100 kHz to about 10 MHz, and a second bias RF power having a frequency in a range from about 10 kHz to about 5 MHz.

According to some example embodiments of inventive concepts, a method of fabricating a semiconductor device may include forming a mold insulation layer on a substrate; and performing a plasma etching process on the mold insulation layer a plasma etching process to form an etched opening that penetrates at least a portion of the mold insulation layer. The performing the plasma etching process may include loading the substrate including the mold insulation layer on a lower electrode in a chamber; and supplying the lower electrode with a plurality of RF powers having frequencies different from each other. The plurality of RF powers may include: a first RF power having a first frequency in a range from about 40 MHz to about 300 MHz; a second RF power having a second frequency in a range from about 100 kHz to about 10 MHz; and a third RF power having a third frequency in a range from about 10 kHz to about 5 MHz.

According to an example embodiment of inventive concepts, a method of operating a plasma apparatus includes generating a plasma in a process chamber that includes a first electrode facing a second electrode. The generating the plasma includes supplying a plurality of RF powers to one of the first electrode and the second electrode. The plurality of RF powers may include: a first RF power having a first frequency in a range from about 40 MHz to about 300 MHz; a second RF power having a second frequency in a range from about 100 kHz to about 10 MHz; and a third RF power having a third frequency in a range from about 10 kHz to about 5 MHz.

DETAILED DESCRIPTION

Figure 1:
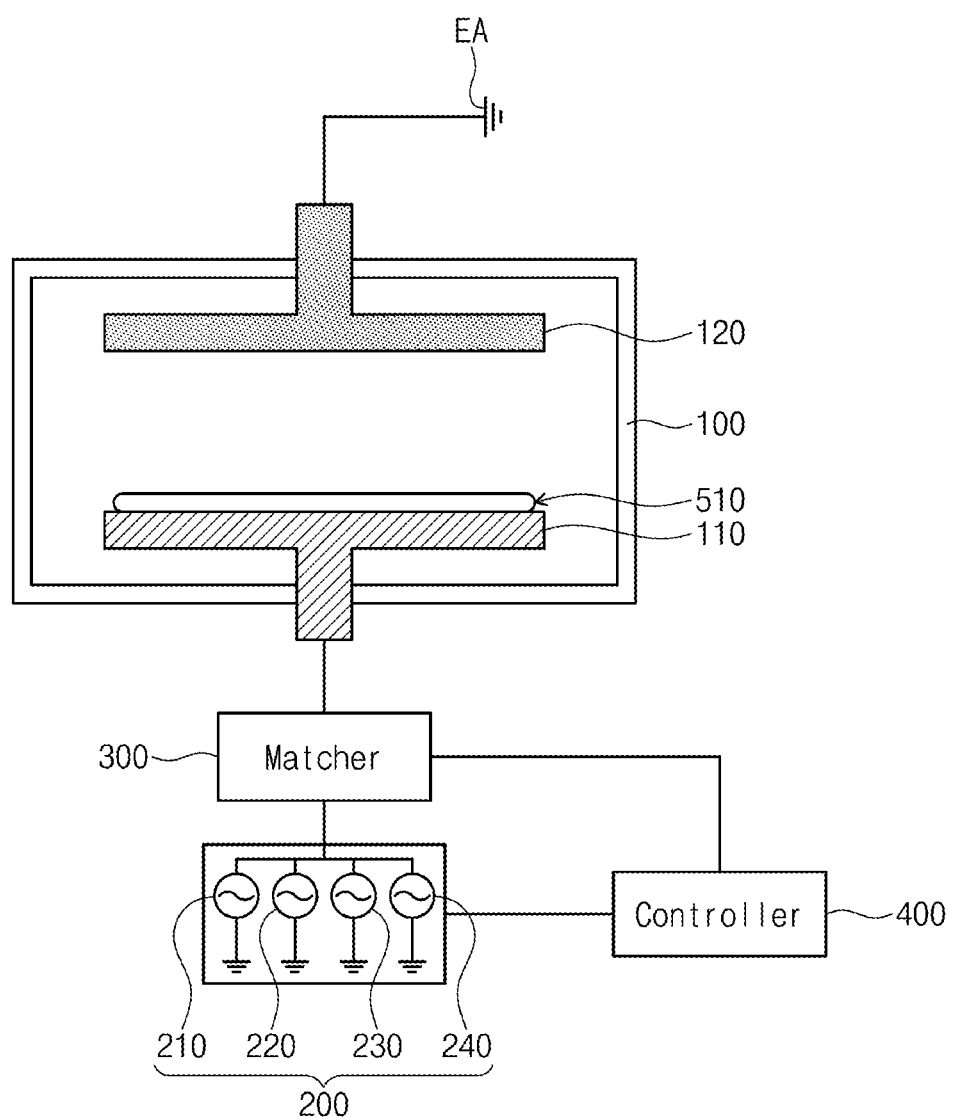
FIG. 1 is a schematic diagram illustrating a plasma etching apparatus according to some example embodiments of inventive concepts.
Figure 2A:
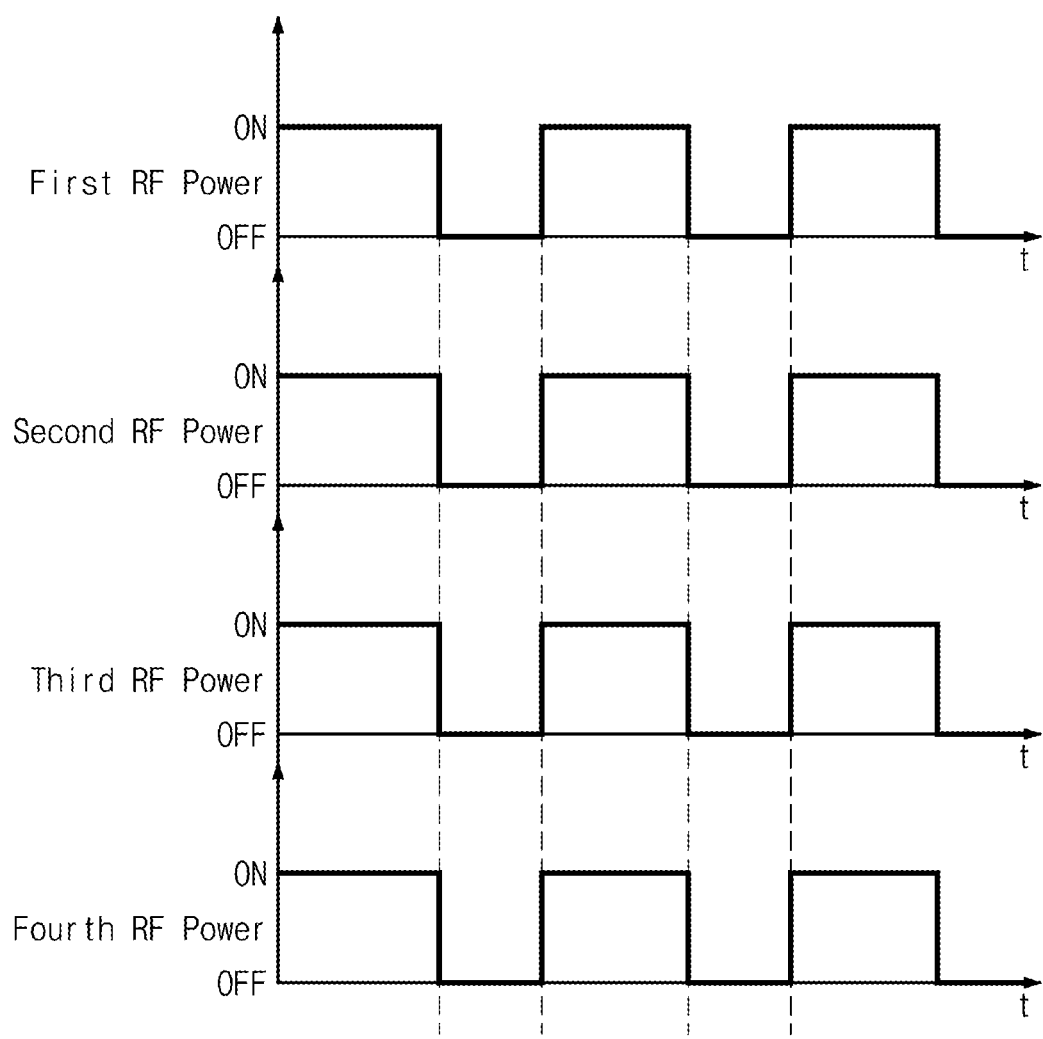
FIGS. 2A and 2B are timing diagrams showing turn-on/off durations of powers applied to a first electrode during a plasma etching process using the plasma etching apparatus of FIG. 1.
Figure 2B:
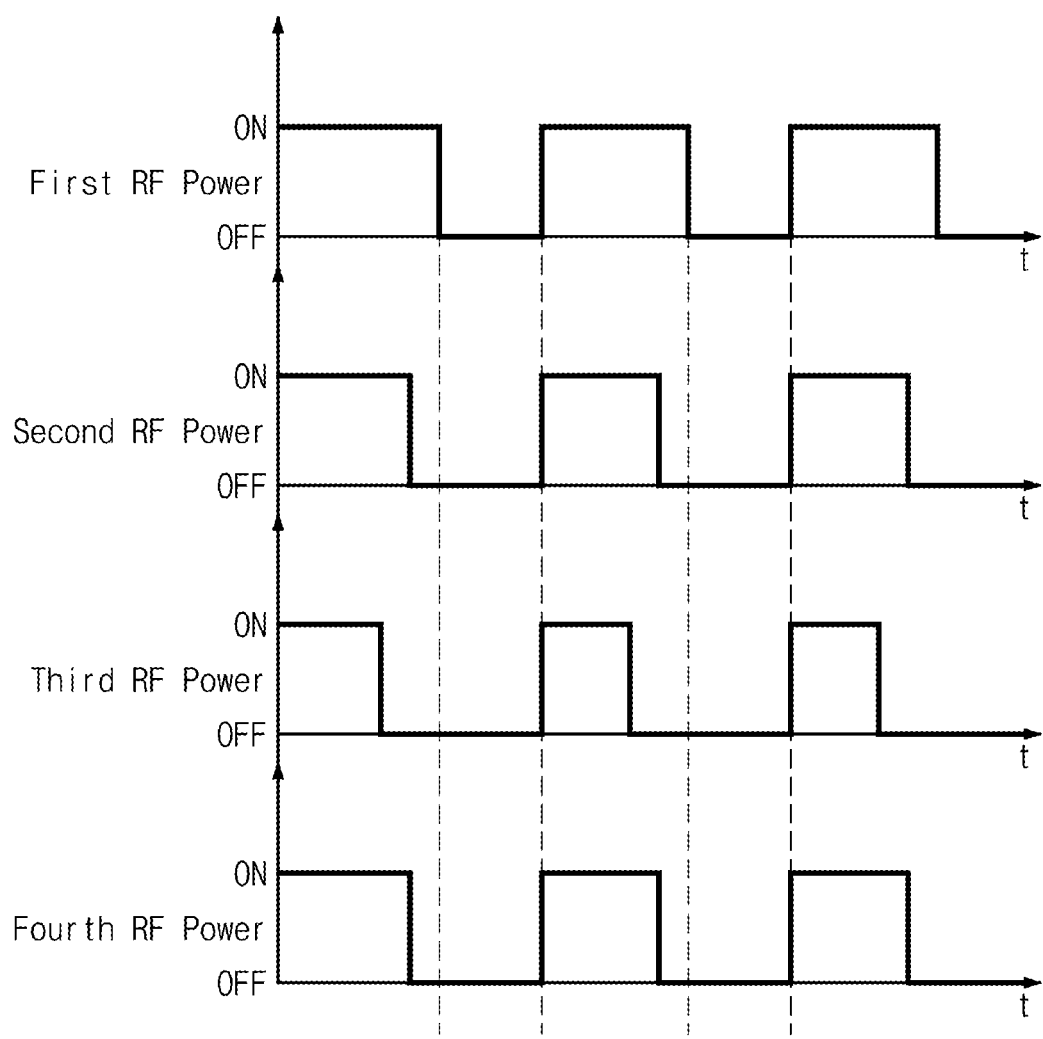
Figure 3:
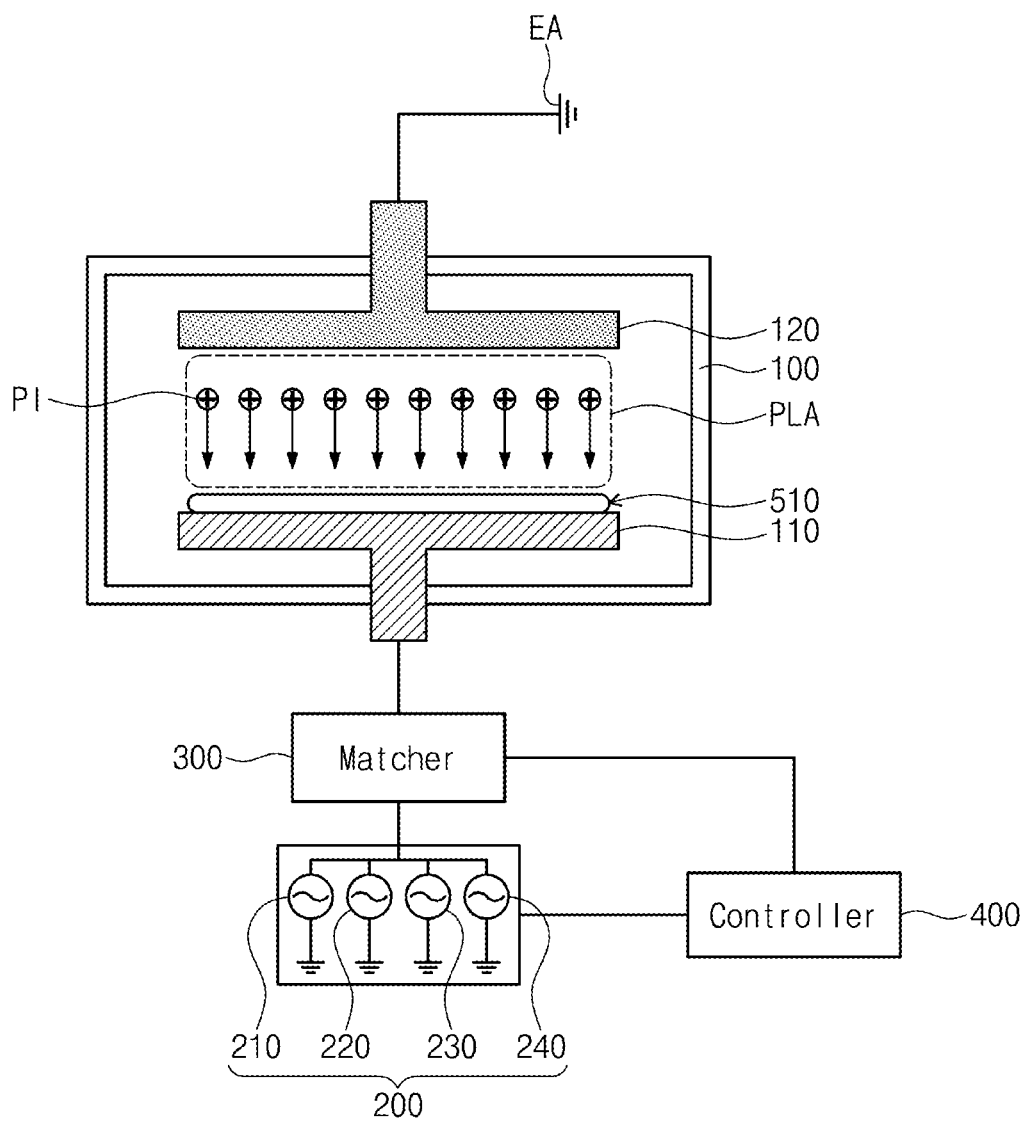
FIG. 3 is a schematic diagram illustrating a plasma etching process conducted in the plasma etching apparatus of FIG. 1.

FIG. 1 is a schematic diagram illustrating a plasma etching apparatus according to some example embodiments of inventive concepts. FIGS. 2A and 2B are timing diagrams showing turn-on/off durations of powers applied to a first electrode during a plasma etching process using the plasma etching apparatus of FIG. 1. FIG. 3 is a schematic diagram illustrating a plasma etching process conducted in the plasma etching apparatus of FIG. 1.

Referring to FIGS. 1 to 3, a plasma etching apparatus 10 according to some example embodiments of inventive concepts may be a capacitively coupled plasma etching apparatus. For example, the plasma etching apparatus 10 may be a dual-frequency capacitively coupled plasma etching apparatus. The plasma etching apparatus 10 may individually control incident ion flux and ion energy which are critical parameter involved in an etching process. The plasma etching apparatus 10 may include a chamber 100, a first electrode 110, a second electrode 120, a RF (radio frequency) power supply unit 200, a matcher 300, and a controller 400.

The chamber 100 may be configured to provide a processing space within which a semiconductor process (e.g., a plasma etching process) is performed. In other words, the chamber 100 may have a hermetically sealed space of a certain size at the interior thereof. The chamber 100 may be variously shaped according to the size or the like of wafer, substrate, or otherwise workpiece. For example, the chamber 100 may have a cylindrical shape corresponding to a disk-shaped substrate 510, but is not limited thereto. The chamber 100 may include at least one of a metal or an insulator. The chamber 100 may include a gas inlet (not shown) for introduction of process gases into the chamber 100 and a gas outlet (not shown) for exhaustion of process gases and/or by-products from the chamber 100. The process gas may be pumped out through the gas outlet such that the chamber 100 may be maintained under a vacuum state. The process gas may include at least one of $CF_4$, $C_4F_6$, $C_4F_8$, COS, $CHF_3$, HBr, $SiCl_4$, $O_2$, $N_2$, $H_2$, $NF_3$, $SF_6$, He or Ar, but example embodiments are not limited thereto. Although not illustrated, at least one pump (e.g., dry pump, vacuum pump, turbo pump) may be connected to the chamber to maintain a vacuum state in the chamber 100.

The first electrode 110 and the second electrode 120 may be provided to face each other within the chamber 100. The first electrode 110 may be disposed spaced apart from the second electrode 120. In some example embodiments, the first electrode 110 may be installed close to a bottom plate of the chamber 100. The second electrode 120 may be installed close to a top side of the chamber 100. The first and second electrodes 110 and 120 may be made of a silicon-containing conductor such as Si or SiC. A top surface of the first electrode 110 and a bottom surface of the second electrode 120 may be a flat surface.

The substrate 510 including an etching target may be loaded on the first electrode 110. The substrate 510 may be a semiconductor substrate or a transparent substrate. The semiconductor substrate may be a silicon substrate, a germanium substrate, or a silicon-germanium substrate. The etching target may be composed of a semiconductor material, a conductive material, an insulating material, or a combination thereof. For example, the etching target may include a semiconductor material such as a semiconductor substrate and/or a semiconductor epitaxial layer. Alternatively, the etching target may include a conductive material such as doped polysilicon, metal silicide, metal, metal nitride, or a combination thereof. Differently, the etching target may include an insulating material such as silicon oxide, silicon nitride, silicon oxynitride, low-k dielectric whose dielectric constant is less than that of silicon oxide, or a combination thereof. Dissimilarly, the etching target may include crystalline silicon, amorphous silicon, impurity doped silicon, silicon-germanium, carbon-based material, or a combination thereof. The etching target may be formed of a single layer or a multiple layer including a plurality of stacked layers. For example, the etching target may include a plurality of stacked insulating layers and further include one or more conductive or semiconductor layers between the stacked insulating layers.

The first electrode 110 may serve as a chuck. For example, the first electrode 110 may be an electrostatic chuck. During a plasma etching process, the first electrode 110 may be supplied with a plurality of RF powers from the RF power supply unit 200. For example, during a plasma etching process, the first electrode 110 may be supplied with a first RF power, a second RF power, a third RF power, and a fourth RF power. The first to fourth RF powers may have frequencies different from each other.

In some example embodiments, the second electrode 120 may act as a shower head for supplying a process gas into the chamber 100. In other words, the second electrode 120 may all serve as the shower head and the electrode used in a plasma etching process. Alternatively, in other example embodiments, the second electrode 120 may only be used as an electrode. In this case, the plasma etching apparatus 10 may include an additional gas supply pipe (not shown) or an additional gas supply nozzle (not shown). The second electrode 120 may be configured to be connected to a reference potential. In some example embodiments, the second electrode 120 may be in the ground state EA during a plasma etching process.

The RF power supply unit 200 may be connected to the first electrode 110. The RF power supply unit 200 may include a first RF power supply 210, a second RF power supply 220, a third RF power supply 230, and a fourth RF power supply 240. Accordingly, the RF power supply unit 200 may apply a plurality of powers to the first electrode 110. The matcher 300 may be connected between the RF power supply unit 200 and the first electrode 110.

The first RF power supply 210 may generate a first high frequency signal having a first frequency. The first RF power supply 210 may apply a first RF power having the first frequency to the first electrode 110 through the matcher 300.

The first frequency may be a high frequency in the range of about 40 MHz to about 200 MHz. In some example embodiments, the first frequency may be about 60 MHz. The first RF power may be used to produce plasma (see PLA of FIG. 3) within the chamber 100. In other words, when the first electrode 110 is supplied with the first RF power, the plasma PLA may be produced from a process gas introduced into the chamber 100. In some example embodiments, the plasma PLA may be a capacitively coupled plasma.

Electron heating efficiency may increase with the first frequency of the first RF power. That is, a plasma density within the chamber 100 may increase in proportion to the first frequency. An increase of the plasma density may improve an etch rate and a processing speed of a plasma etching process.

As the first frequency increases, the standing wave effect (SWE) may become severe and thus an uniformity of the plasma density may decrease. In other words, the plasma density may be higher at a central core portion of the chamber 100 and lower at a circumferential portion of the chamber 100. Accordingly, the etching target may include highly etchable portions corresponding to the central core portion of the chamber 100 and less etchable portions corresponding to the circumferential portion of the chamber 100. The term of standing wave effect may mean a phenomenon in which the plasma density is concentrated on a specific section. In general, the standing wave effect may be strengthened as the frequency increases.

The second RF power supply 220 may generate a second high frequency signal having a second frequency. The second RF power supply 220 may apply a second RF power having the second frequency to the first electrode 110 through the matcher 300. The second frequency may be a high frequency in the range of about 10 MHz to about 20 MHz, or in the range of about 10 MHz to about 15 MHz, which is less than the first frequency. In some example embodiments, the second frequency may be about 13.56 MHz.

The second RF power may be used to equalize the plasma density within the chamber 100. Specifically, the second RF power may also generate the plasma PLA. However, since the second RF power has the second frequency less than the first frequency of the first RF power, the standing wave effect may weakly affect the plasma PLA generated at the second RF power compared with the plasma PLA generated at the first RF power. Therefore, an uniformity of the plasma density within the chamber 100 may be enhanced when the first electrode 110 is supplied with the first and second RF powers at the same time. The uniformity of the plasma density within the chamber 100 may enable the plasma etching apparatus 10 to etch a large-sized etching target.

The third RF power supply 230 may generate a first low frequency signal having a third frequency. The third RF power supply 230 may apply a third RF power having the third frequency to the first electrode 110 through the matcher 300. The third frequency may be a low frequency in the range of about 2 MHz to about 5 MHz less than the second frequency. In some example embodiments, the third frequency may be about 2 MHz. The third RF power may be used to make cations PI in the plasma PLA incident onto the substrate 510. In other words, the cations PI in the plasma PLA may be incident onto the substrate 510 when the first electrode 110 is supplied with the third RF power.

The third frequency may be substantially the same as or similar to a natural frequency of the cation PI in the plasma PLA. Thus, the cations PI in the plasma PLA may be incident onto the first electrode 110. The cations PI incident onto the first electrode 110 may accelerate within the plasma sheath region. The plasma sheath region may be formed between the plasma PLA and the first electrode 110.

Since the third frequency is a low frequency, the cations PI in the plasma PLA may have increased ion energy. This may be because impedance decreases with frequency. As the ion energy of the cations is increased, an etch rate of the etching target may be enhanced.

The fourth RF power supply 240 may generate a second low frequency signal having a fourth frequency. The fourth RF power supply 240 may apply a fourth RF power having the fourth frequency to the first electrode 110 through the matcher 300. The fourth frequency may be a low frequency in the range of about 300 kHz to about 1 MHz less than the third frequency. In some example embodiments, the fourth frequency may be about 400 kHz. The fourth RF power may be used to equalize an ion energy distribution of the cations PI incident onto the substrate 510. In other words, the ion energy of the cations PI may be uniformly distributed when the first electrode 110 is supplied with the fourth RF power, which will be discussed in detail with reference to FIG. 4. The first to fourth frequencies may be a radio frequency (RF).

The controller 400 may be connected to the RF power supply unit 200 and the matcher 300. The controller 400 may provide control signals to the first to fourth RF power supplies 210 to 240 so as to control each thereof. The control signal may include a pulsed signal and information about phase of the pulsed signal. The pulsed signal may have a predetermined frequency and duty ratio. For example, the controller 400 may control turns-on or turns-off of the first to fourth RF powers respectively produced from the first to fourth RF power supplies 210 to 240. The first to fourth RF powers may thus be pulse-modulated by the pulse signal (see FIGS. 2A and 2B). Alternatively, in other example embodiments, the controller 400 may not control to pulse modulate the first to fourth RF powers.

The pulsed signal may have a frequency of, but not limited to, about 10 kHz. The pulsed signal may have a duty ratio of, but not limited to, about 70%. Accordingly, the first to fourth RF powers may be pulse-modulated at a frequency of about 10 kHz. The pulse-modulated RF powers may have a duty ratio of about 70%. The pulse modulation of the RF powers may be synchronized with each other. In some example embodiments, the first to fourth RF powers may be turned on and/or turned off at the same time. For example, as shown in FIG. 2A, during a plasma etching process, the second to fourth RF powers may be turned on in synchronization when the first RF power is turned on. Likewise, the second to fourth RF powers may be turned off in synchronization when the first RF power is turned off. Accordingly, the first to fourth RF powers may have the same duty ratio. Alternatively, in other example embodiments, at least one of the second to fourth RF powers may be turned off differently from the first RF power. For example, as shown in FIG. 2B, during a plasma etching process, the second to fourth RF powers may be turned on in synchronization when the first RF power is turned on. The second and fourth RF powers may be turned off before the first RF power is turned off. The third RF power may be turned off before the second and fourth RF powers may be turned off. In other words, at least one of the first to fourth RF powers may have a duty ratio different from those of the others.

The first to fourth RF powers may be pulse-modulated in synchronization with each other. In some example embodiments, the first to fourth RF powers may be pulse-modulated to turn on at the same time.

When the first to fourth RF powers are turned on, the cations PI in the plasma PLA may be incident toward the substrate 510 and thus the etching target may be partially etched. An etched opening may then be formed on the etching target. In this step, the cations PI may accumulate on a floor surface of the etched opening.

When the first to fourth RF powers are turned off, electrons in the plasma PLA remaining within the chamber 100 may be incident toward the substrate 510. The electrons incident onto the substrate 510 may neutralize the cations accumulated on the etching target. In other words, the electrons may accumulate on the floor surface of the etched opening.

When the first to fourth RF powers are turned on again, the accumulated electrons may cause the cations PI in the plasma PLA to accelerate into the floor surface of the etched opening. This cyclically repetitive turn-on/off duration may form the etched opening having a high aspect ratio on the etching target. The aspect ratio of the etched opening may be about 20:1 to about 100:1. For example, the etched opening may have a hole shape whose aspect ratio is high, but the present inventive concept is not limited thereto; for example, the etched opening may be shaped like a via, a groove, a contact, a linear pattern, a trench, etc. The term of aspect ratio may mean that a ratio of height to width of the etched opening. The height may mean a distance from the floor surface of the etched opening to a top surface of the etching target. The width may mean a spaced distance between oppositely facing inner sidewalls of the etched opening.

The matcher 300 may be positioned between the RF power supply unit 200 and the chamber 100. The matcher 300 may reduce and/or minimize loss of the RF power generated from the RF power supply unit 200. It therefore may be obtained an increased transfer efficiency of the RF powers provided from the RF power supply unit 200 to the first electrode 110. The matcher 300 may be integrated with the controller 400 to constitute a single unitary body.

Figure 4:
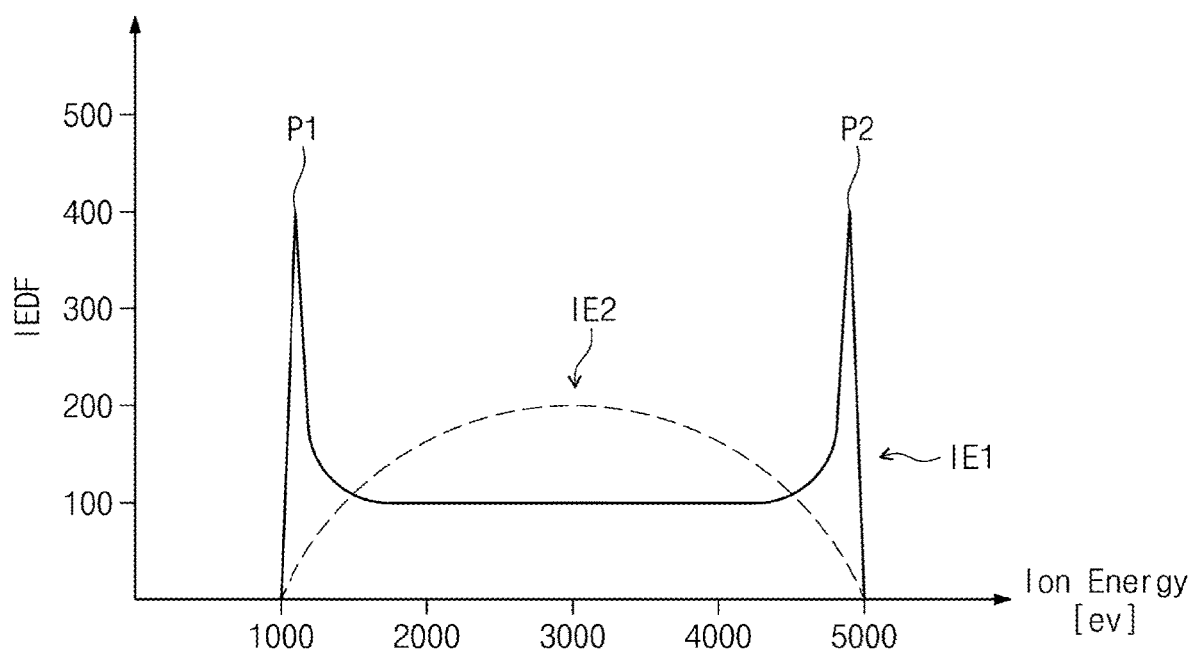
FIG. 4 is a graph showing an ion energy distribution according to whether the fourth RF power is applied to a first electrode of FIG. 1.
Figure 5:
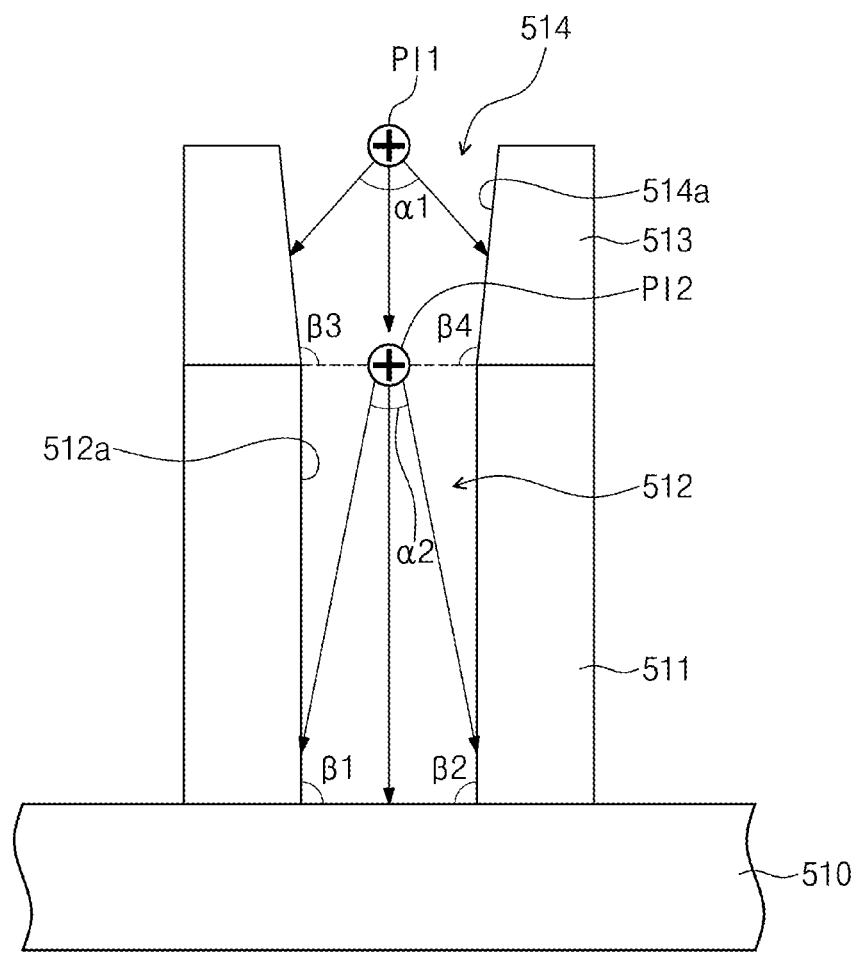
FIG. 5 shows the etching behavior of plasma cations on an etching target when first to third RF powers are applied to a first electrode of FIG. 1.
Figure 6:
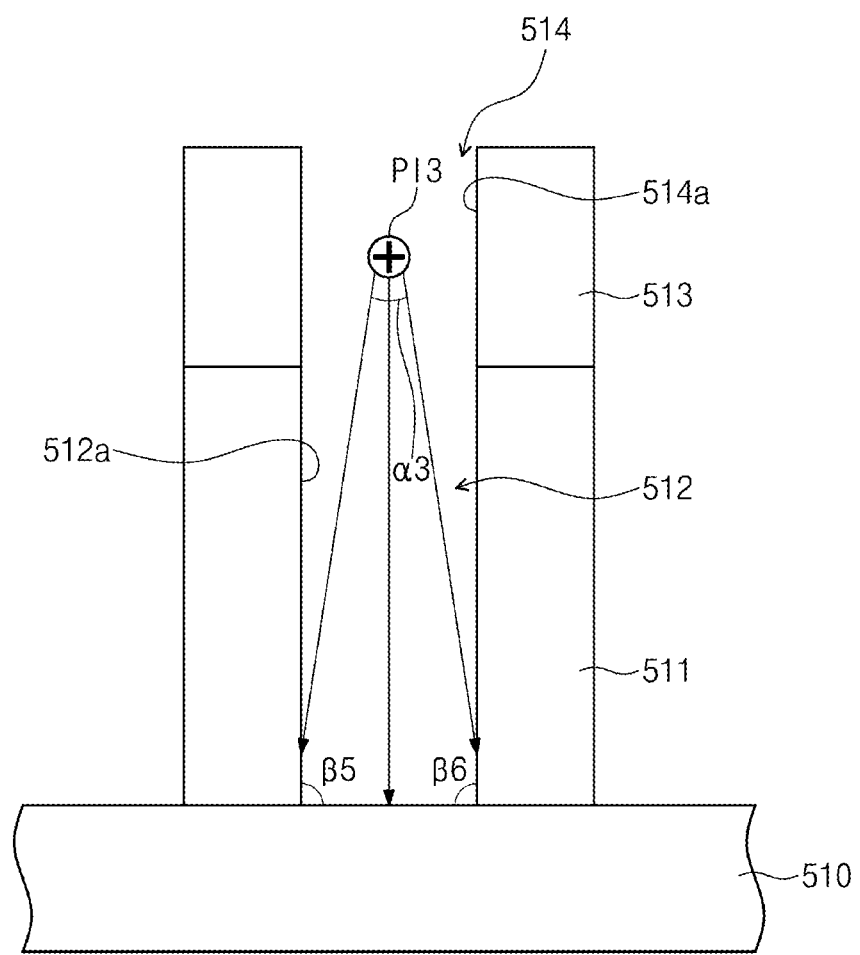
FIG. 6 shows the etching behavior of plasma cations on an etching target when first to fourth RF powers are applied to a first electrode of FIG. 1.

FIG. 4 is a graph showing an ion energy distribution according to whether the fourth RF power is applied to the first electrode of FIG. 1. FIG. 5 shows the etching behavior of plasma cations on the etching target when the first to third RF powers are applied to the first electrode of FIG. 1. FIG. 6 shows the etching behavior of plasma cations on the etching target when the first to fourth RF powers are applied to the first electrode of FIG. 1. FIGS. 7 to 10 are graphs showing ion energy distributions according to frequency variation of the fourth RF power applied to the first electrode. In FIGS. 4, and 7 to 10, the first electrode 10 is supplied with the first RF power of about 60 MHz, the second RF power of about 13.56 MHz, the third RF power of about 2 MHz, and the fourth RF power. Also, in FIGS. 4, and 7 to 10, the x axis represents a value of ion energy (eV) and the y axis denotes a value of IEDF (ion energy distribution function).

Referring to FIGS. 1 to 4, when the first electrode 110 is supplied only with the first to third RF powers, the cations PI in the plasma PLA may have an ion energy distribution IE1 including bimodal peak regions P1 and P2. The bimodal peak regions P1 and P2 may include a low peak region P1 of about 1000 eV and a high peak region P2 of about 5000 eV. The cations PI distributed in the low peak region P1 may have an ion energy less than that of the cations PI distributed in the high peak region P2. In this description, the peak region may mean a region having an ion energy distribution whose value is about 4 times an average of ion energy distribution in other regions.

When the first electrode 110 is supplied with the first to fourth RF powers, the cations PI in the plasma PLA may have an ion energy distribution IE2 devoid of the bimodal peak regions P1 and P2. Namely, the cations PI in the plasma PLA may have a uniform ion energy distribution when the first electrode 110 is supplied with the first to fourth RF powers than with the first to third RF powers.

Referring to FIGS. 1 to 6, an etching target 511 on the substrate 510 may be etched using a mask layer 513. The mask layer 513 may include a mask opening 514 which exposes an etching portion of the etching target 511. A plurality of cations PI1, PI2 and PI3 incident toward the first electrode 110 may strike the etching target 511 after passing through the mask opening 514 of the mask layer 513. The etching target 511 exposed through the mask opening 514 may then be etched to form an etched opening 512. For example, cations PI1 may be positive ions having a low ion energy corresponding to the low peak region P1, cations PI2 may be positive ions having a high ion energy corresponding to the high peak region P2, and cations PI3 may be positive ions having a uniform ion energy corresponding to the ion energy distribution IE2. In some example embodiments, the cations PI1, PI2 and PI3 may anisotropically etch the etching target 511. The etched opening 512 may have a hole shape whose aspect ratio is high, but example embodiment are not limited thereto.

When a plasma etching process is performed under a condition that the first electrode 110 is supplied only with the first to third RF powers, as shown in FIG. 5, the high energy cations PI2 may be incident toward the substrate 510 at a narrow angular distribution α2. The high energy cations PI2 may have a high directionality. Accordingly, the high energy cations PI2 may etch the etching target 511 at high speeds. However, the high energy cations PI2 may also etch the substrate 510. Moreover, the high energy cations PI2 may lead to degradation of etch profile on a lower portion of the etching target 511.

The low energy cations PI1 may have a low directionality compared with the high energy cations PI2. The low energy cations PI1 may be incident toward the substrate 510 at a wide angular distribution α1. Accordingly, the low energy cations PI1 may etch inner sidewalls 514a of the mask opening 514. As the low energy cations PI1 etches the inner sidewalls 514a of the mask opening 514, a shape of the mask opening 514 may be changed. In this situation, it may lead to failed pattern in the etching target 511. For example, angles (31 and β2 between the substrate 510 and inner sidewalls 512a of the etched opening 512 may be different from angles β3 and β4 between the substrate 510 and the inner sidewalls 514a of the mask opening 514. For example, the angles β3 and β4 may be greater than the angles β1 and β2.

In some example embodiments, when a plasma etching process is performed under a condition that the first electrode 110 is supplied with the first to fourth RF powers, the cations PI3 in the plasma PLA may have a uniform ion energy distribution compared with the cations PI1 and PI2 generated when the first electrode 110 is supplied with the first to third RF powers. Accordingly, as shown in FIG. 6, the cations PI3 may be incident toward the substrate 510 at an angular distribution α3, and thus it may be avoided or minimized problems such as degradation of etch profile on the lower portion of the etching target 511 and shape distortion of the mask opening 514. According to some example embodiments, the fourth RF power may have the fourth frequency in the range of about 300 kHz to about 1 MHz. The cations PI3 may have a superior ion energy distribution in the aforementioned range of the fourth frequency, which will be discussed in detail with reference to FIGS. 7 to 10.

In FIGS. 7 to 10, the first electrode 110 may be supplied with the fourth RF power whose frequency is about 1.1 MHz, 1 MHz, 300 kHz, and 200 kHz, respectively.

Figure 7:
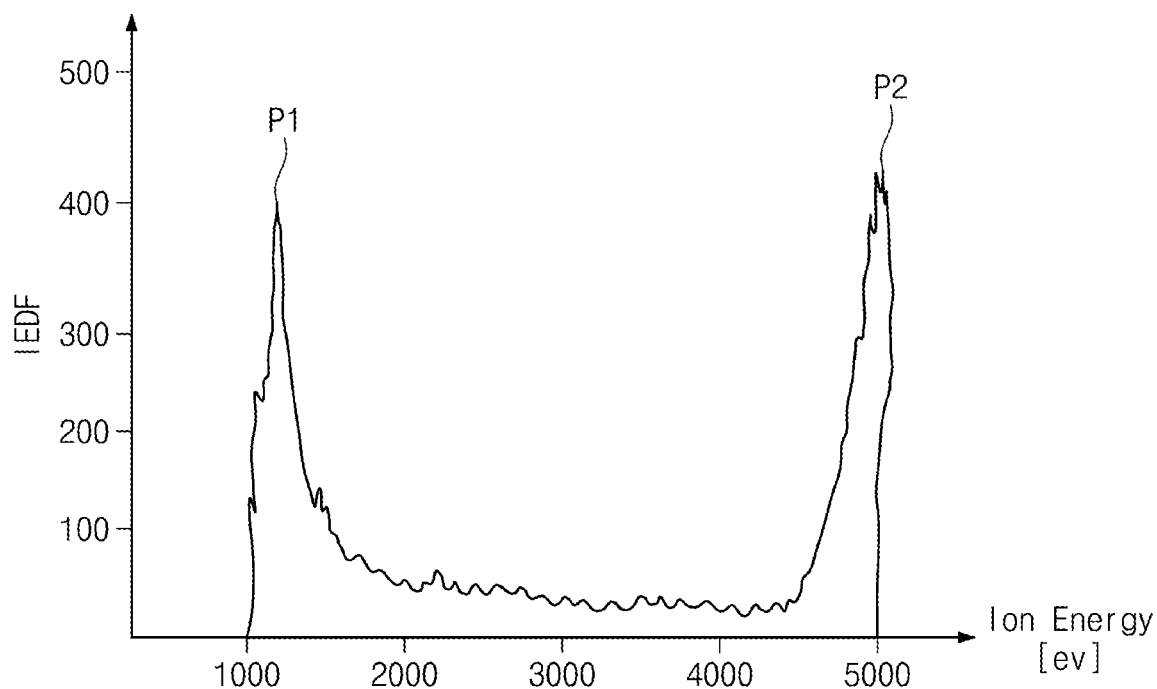
FIGS. 7 to 10 are graphs showing ion energy distributions according to frequency variation of a fourth RF power applied to a first electrode.

Referring to FIG. 7, when the fourth RF power having frequency of about 1.1 MHz is provided to the first electrode 110 which has been supplied with the first to third RF powers, the plasma cations PI3 may have an ion energy distribution inclusive of the bimodal peak regions P1 and P2.

Figure 8:
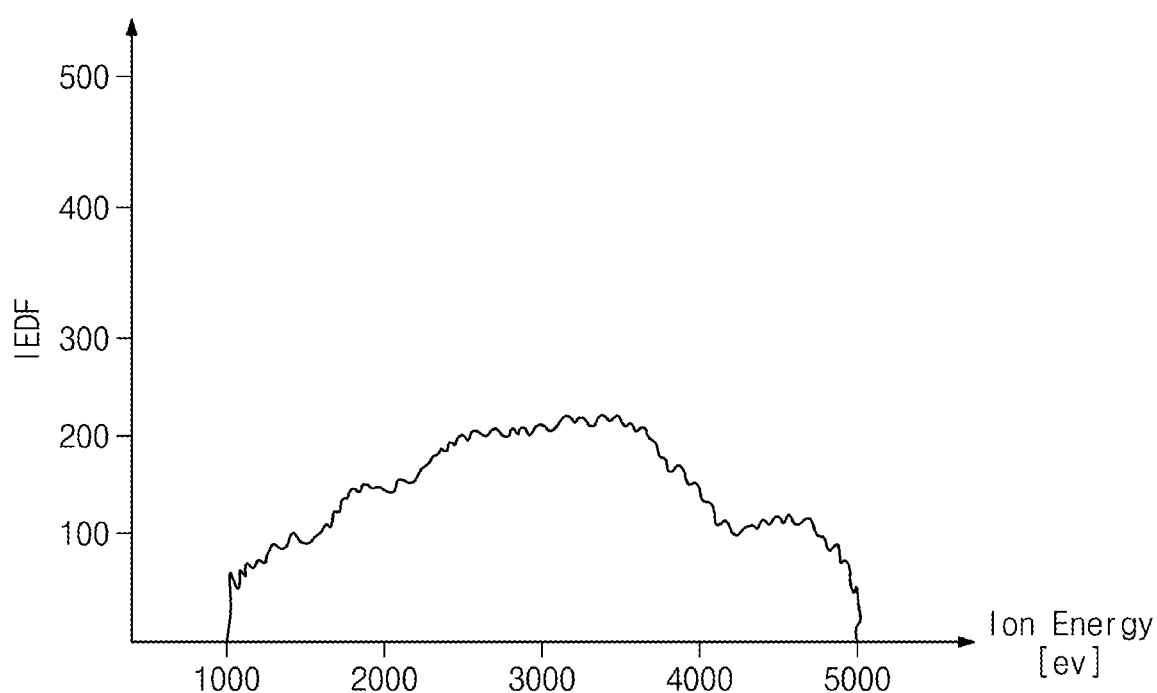

Referring to FIG. 8, when the fourth RF power having frequency of about 1 MHz is provided to the first electrode 110 which has been supplied with the first to third RF powers, the plasma cations PI3 may have an ion energy distribution devoid of the bimodal peak regions P1 and P2.

Figure 9:
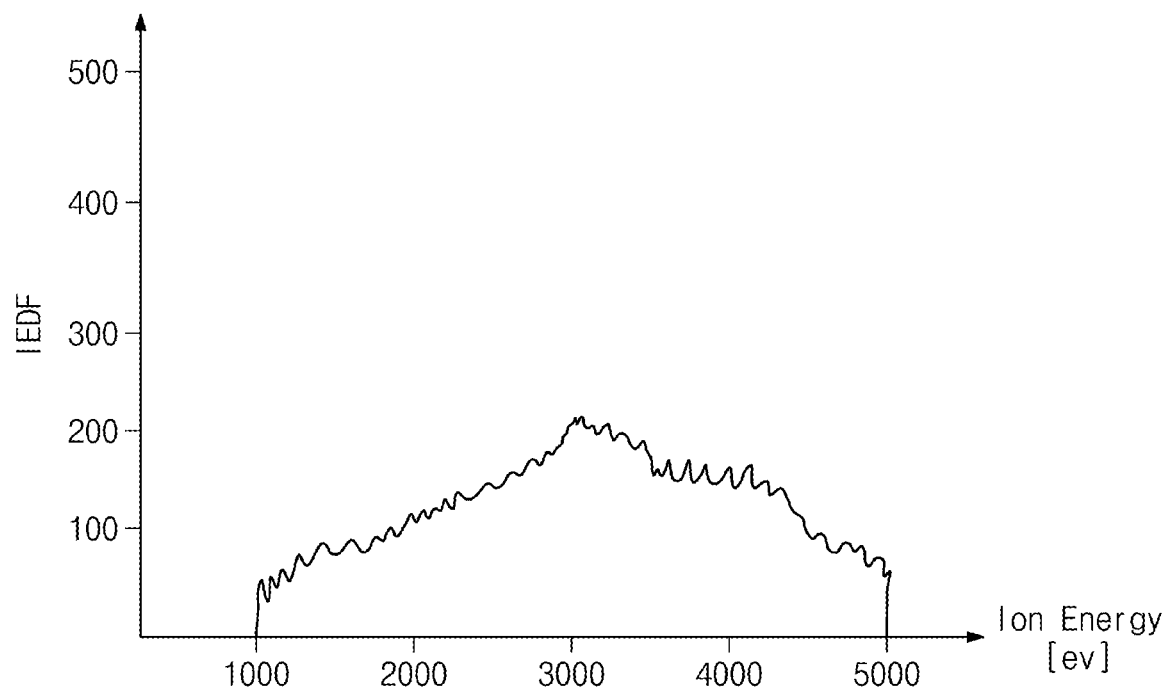

Referring to FIG. 9, when the fourth RF power having frequency of about 300 kHz is provided to the first electrode 110 which has been supplied with the first to third RF powers, the plasma cations PI3 may have an ion energy distribution devoid of the bimodal peak regions P1 and P2.

Figure 10:
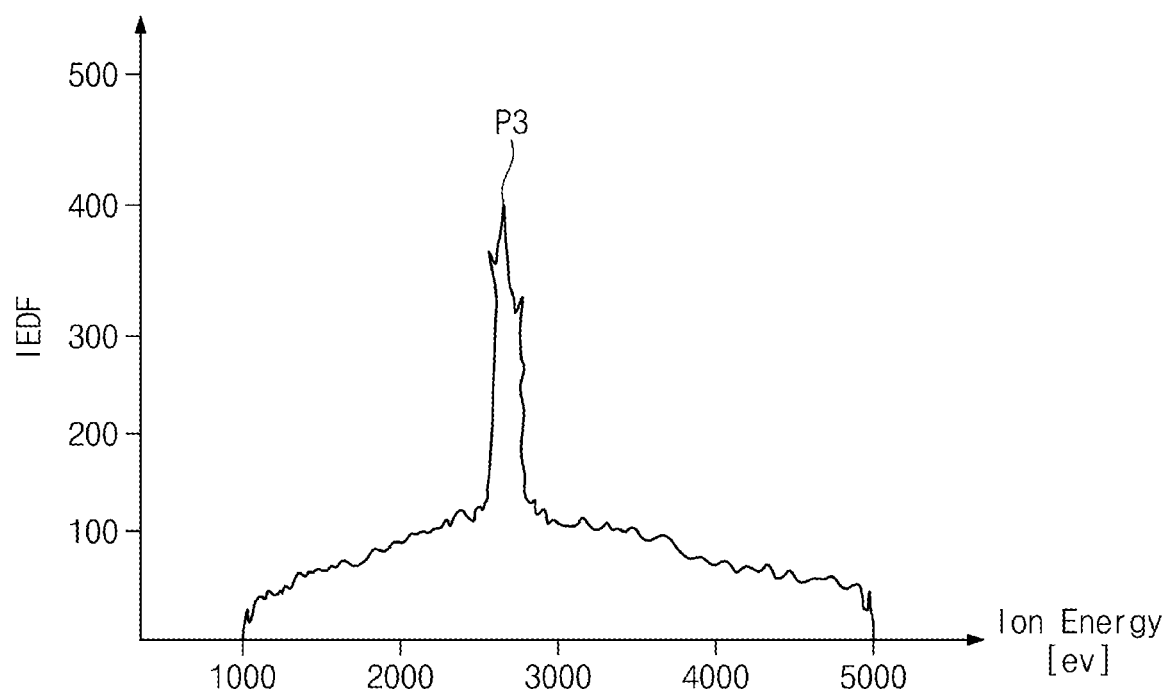

Referring to FIG. 10, when the fourth RF power having frequency of about 200 kHz is provided to the first electrode 110 which has been supplied with the first to third RF powers, the plasma cations PI3 may have an ion energy distribution inclusive of a middle peak region P3. Accordingly, most of the plasma cations PI3 may have ion energy of about 3000 eV. The middle peak region P3 may be positioned between the low peak region P1 and the high peak region P2.

In conclusion, as shown in FIGS. 7 to 10, when the fourth RF power has the fourth frequency in the range of about 300 kHz to about 1 MHz, it may be ascertained that the plasma cations PI3 have a uniform ion energy distribution.

Figure 11:
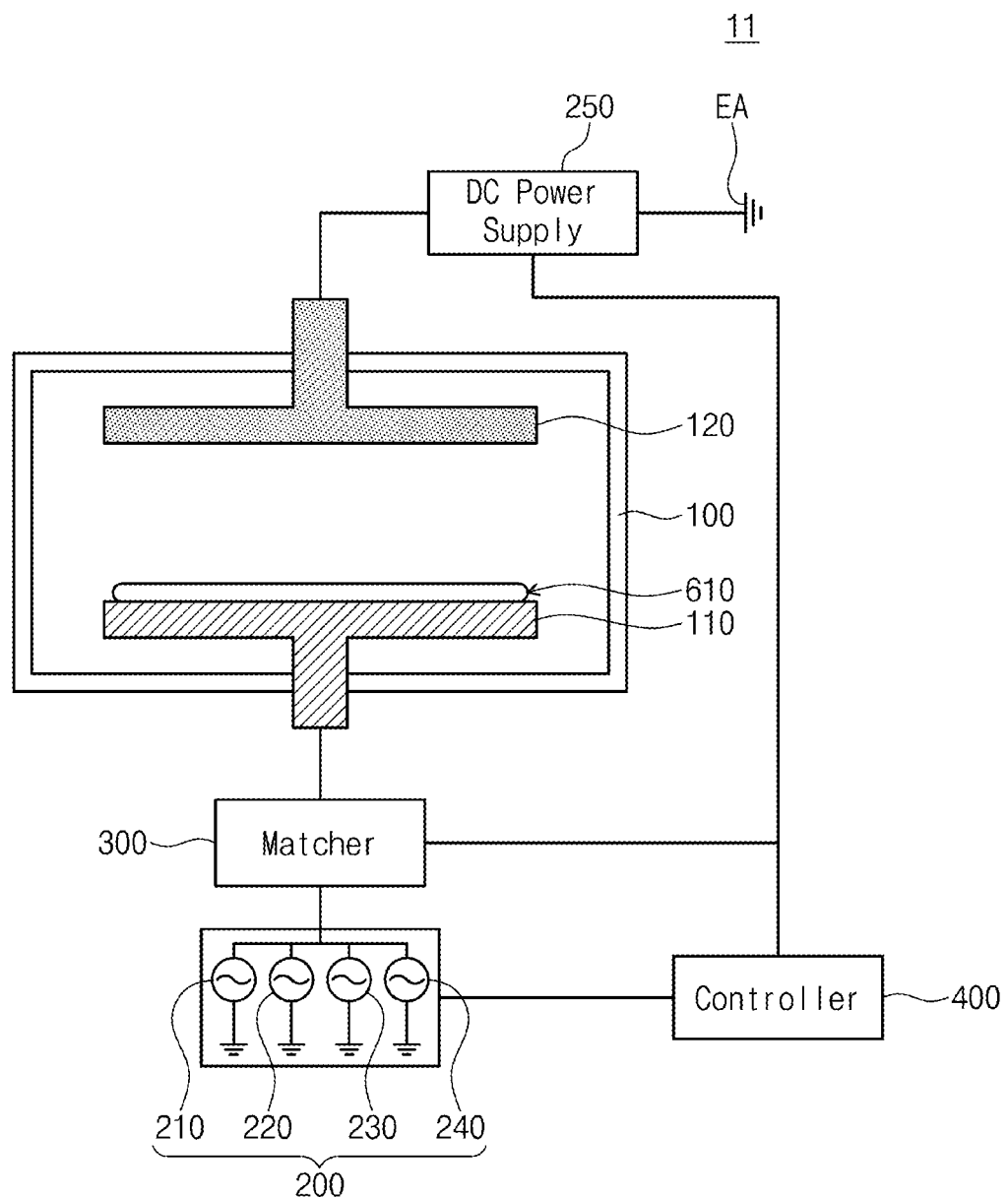
FIG. 11 is a schematic diagram illustrating a plasma etching apparatus according to some example embodiments of inventive concepts.
Figure 12:
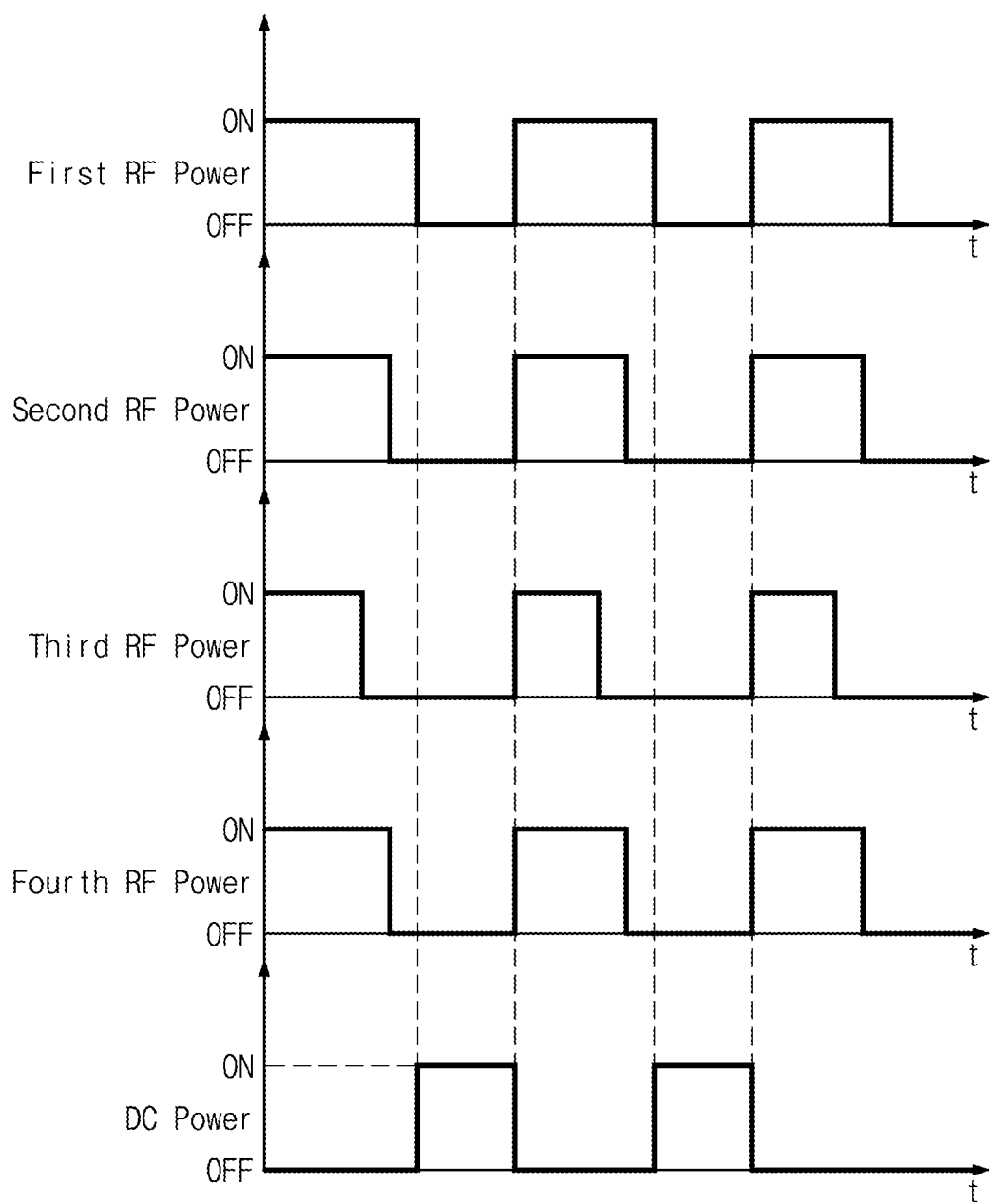
FIG. 12 is a timing diagram showing turn-on/off durations of powers applied to a first electrode during a plasma etching process using the plasma etching apparatus of FIG. 11.

FIG. 11 is schematic diagram illustrating a plasma etching apparatus according to some example embodiments of inventive concepts. FIG. 12 is a timing diagram showing turn-on/off durations of powers applied to the first electrode during a plasma etching process using the plasma etching apparatus of FIG. 11.

Referring to FIGS. 11 and 12, a plasma etching apparatus 11 may include a chamber 100, a first electrode 110, a second electrode 120, a RF (radio frequency) power supply unit 200, a DC (direct current) power supply 250, and a controller 400. A substrate 610 may be placed on the first electrode 110. A detail description of the substrate 510 of FIG. 1 may also be identically or similarly applicable to the substrate 610. In the embodiment that follows, a description of features the same as those in the foregoing embodiment discussed with reference to FIG. 1 will be omitted or abridged in the interest of brevity of the description.

The DC power supply 250 may be connected to the second electrode 120. The DC power supply 250 may be in the ground state EA. The DC power supply 250 may provide a negative DC power to the second electrode 120. The negative DC power may attract cations in the plasma to the second electrode 120. The negative DC power may repel electrons in the plasma toward the first electrode 110. In other words, an attractive force may be generated between the negative DC power and the cations in the plasma. A repulsive force may be generated between the negative DC power and the electrons in the plasma.

The controller 400 may be connected to the matcher 300, the RF power supply unit 200, and the DC power supply 250. Control signals may be transmitted from the controller 400 to the first to fourth RF power supplies 210 to 240 and the DC power supply 250, and thus the controller 400 may control each of the first to fourth RF power supplies 210 to 240 and the DC power supply 250. For example, the controller 400 control turns on/off of the first to fourth RF powers respectively produced from the first to fourth RF power supplies 210 to 240. The first to fourth RF powers may therefore be pulse-modulated according to pulse signals. The controller 400 may control turn-on/off of the DC power produced from the DC power supply 250. The negative DC power may therefore be pulse-modulated according to a pulse signal (see FIG. 12).

The first to fourth RF powers may be pulse-modulated in synchronization with each other. The negative DC power may be pulse-modulated inversely with the first to fourth RF powers. The negative DC power may be adjusted in synchronization with turns on/off of the first to fourth RF powers. For example, the negative DC power may increase to a second voltage from a first voltage at the same time when the first to fourth RF powers are turned off. The negative DC power may be decrease to the first voltage from the second voltage at the same time when the first to fourth RF powers are turned on. In other words, the negative DC power may be adjusted to have a greater magnitude during the turns-off of the first to fourth RF powers than during the turns-on of the first to fourth RF powers. The negative DC power may be kept constant during the turns-off of the first to fourth RF powers. Alternatively, in other example embodiments, the negative DC power may increase and/or decrease during the turns-off of the first to fourth RF powers. For example, the first voltage may be 0 Volt, but not limited thereto.

When the first to fourth RF powers are turned off and the negative DC power is turned on, the electrons in the plasma remaining within the chamber 100 may be incident toward the substrate 610 by the repulsive force. The electrons incident onto the substrate 610 may neutralize the cations accumulated on the etching target on the substrate 610. In other words, the electrons may accumulate on the floor surface of the etched opening. When the first to fourth RF powers are returned to the turn-on state and the negative DC power is back to the turn-off state, the accumulated electrons may allow the cations in the plasma to accelerate into the floor surface of the etched opening. This cyclically repetitive turn-on/off duration may form the etched opening having a high aspect ratio on the etching target. For example, the aspect ratio may be about 50:1.

Ii will be hereinafter described a method of plasma etching according to some example embodiments of inventive concepts with reference to FIGS. 1 to 12.

The chamber 100 may be provided therein with the first and second electrodes 110 and 120 facing each other. The substrate 510 or 610 having the etching target 511 formed thereon may be loaded on the first electrode 110 within the chamber 100. After the substrate 510 or 610 is loaded on the first electrode 110, a process gas may be introduced into the chamber 100 through the gas inlet (not shown). After the process gas is introduced into the chamber 100, the plasma PLA may be generated from the process gas so as to etch the etching target 511 of the substrate 510 or 610 loaded on the first electrode 110.

Hereinafter, a process for etching the etching target 511 will be discussed in detail. The first electrode 110 may be supplied with a plurality of RF powers of which frequencies are different from each other. The plurality of RF powers may include the first RF power utilized to generate the plasma PLA within the chamber 100, the second RF power utilized to equalize the plasma density within the chamber 100, the third RF power utilized to make the cations PI in the plasma PLA incident toward the substrate 510 or 610, and the fourth RF power utilized to homogenize the ion energy distribution of the cations PI incident onto the substrate 510 or 610. The cations PI incident onto the substrate 510 or 610 may etch the etching target 511. The first to fourth RF powers may be applied to the first electrode 110 at the same time.

When the first to fourth RF powers are turned off, the etching of the etching target 511 may be suspended. During the suspension of the etching process, the electrons in the plasma PLA remaining within the chamber 100 may be incident toward the substrate 510 or 610. The electrons incident onto the substrate 510 or 610 may neutralize the cations PI accumulated on the etching target 511 during the etching process. Alternatively, in other example embodiments, the DC power may be turned on and thus the second electrode 120 may be supplied with the DC power during the suspension of etching process. As the second electrode 120 is supplied with the DC power, the cations PI3 accumulated on the etching target 511 may be neutralized.

The first to fourth RF powers may be turned on again. Accordingly, the plasma PLA may be generated again within the chamber 100 and then the cations PI in the plasma PLA may be incident toward the substrate 510 or 610 so as to etch the etching target 511. These steps may be repeatedly performed to form the etched opening 512 on the etching target 511.

It will be hereinafter explained a method of fabricating a semiconductor device using a method of plasma etching according to some example embodiments of inventive concepts.

FIGS. 13 to 18 are cross-sectional views illustrating a method of fabricating a semiconductor device using a method of plasma etching according to some example embodiments of inventive concepts. FIGS. 13 to 18 show an etching of an etching target using the plasma etching apparatus of FIG. 1, but the present inventive concept is not limited thereto; for example, the plasma etching apparatus of FIG. 11 may be employed. It will be hereinafter explained a process for fabricating a semiconductor device with reference to FIGS. 1 to 3.

Figure 13:
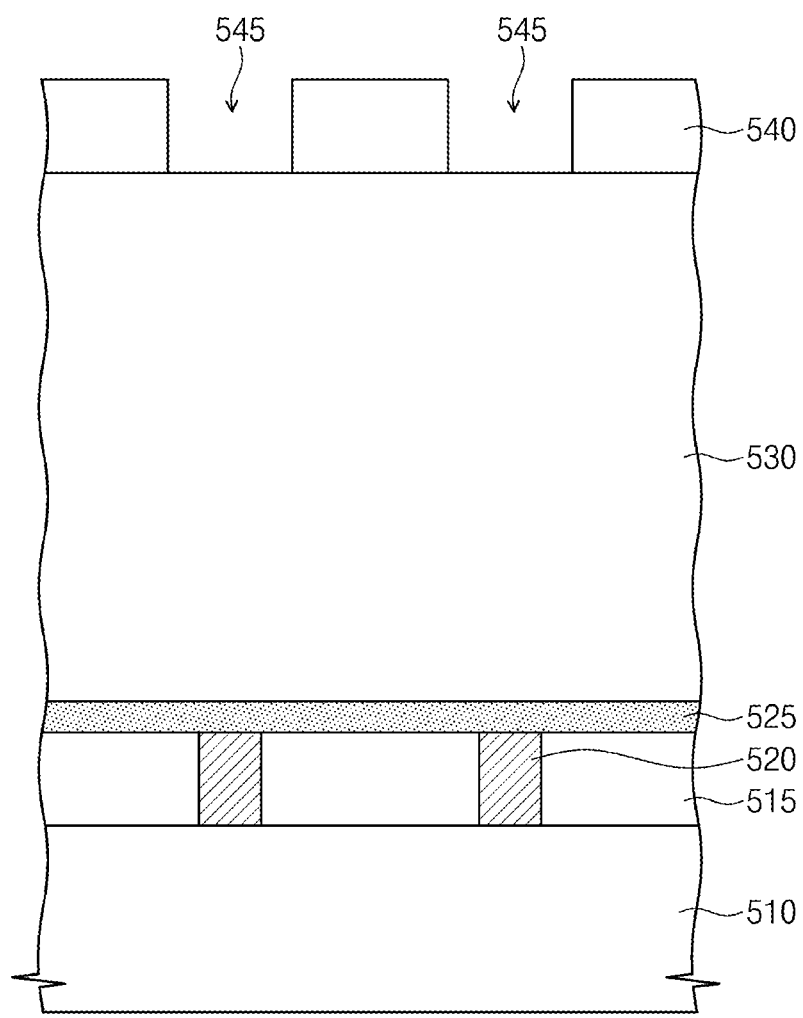
FIGS. 13 to 18 are cross-sectional views illustrating a method of fabricating a semiconductor device using a plasma etching method according to some example embodiments of inventive concepts.

Referring to FIG. 13, an interlayer dielectric layer 515 may be formed on a substrate 510. A plurality of contact plugs 520 may be formed to penetrate the interlayer dielectric layer 515. An etch stop layer 525 and a mold insulation layer 530 may be sequentially formed on the interlayer dielectric layer 515. The etch stop layer 525 may include an insulating material having an etch selectivity with to the mold insulation layer 530. For example, the etch stop layer 525 may include a silicon nitride layer and the mold insulation layer 530 may include a silicon oxide layer. A mask layer 540 having a mask opening 545 therein may be formed on the mold insulation layer 530. The mold insulation layer 530 may be an etching target which will be etched using the plasma etching apparatus 10.

Figure 14:
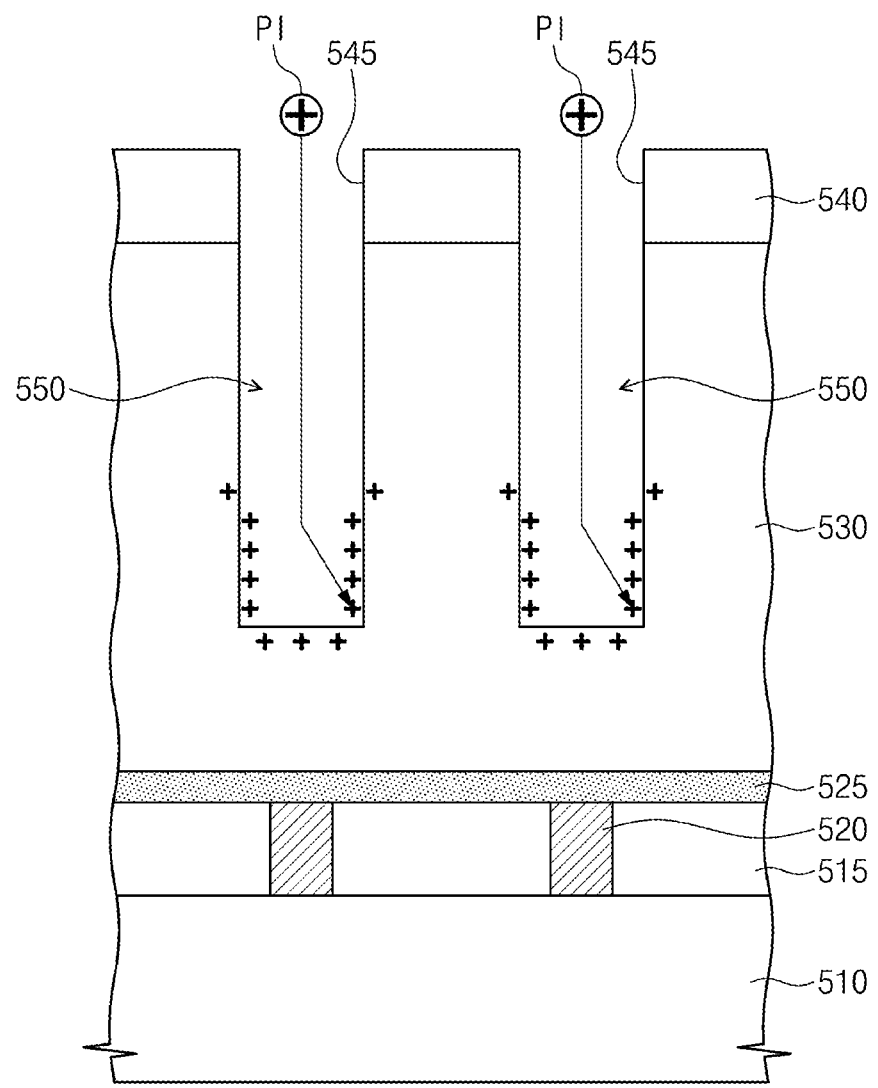

Referring to FIG. 14, the substrate 510 having the mold insulation layer 530 formed thereon may be loaded on the first electrode 110 within the chamber 100. The first electrode 110 may be supplied with a plurality of RF powers so as to generate plasma PLA and thus cations PI in the plasma PLA may be incident toward the substrate 510.

When the first electrode 110 is supplied with the plurality of RF powers, the plasma PLA may be generated from a process gas. Cations PI in the plasma PLA may accelerate into the substrate 510 on the first electrode 110. The accelerated cations PI into the substrate 510 may be incident toward the mold insulation layer 530 on the substrate 510 after passing through the mask opening 545 of the mask layer 540. The mold insulation layer 530 may be etched by the cations PI incident thereonto. Accordingly, the cations PI in the plasma PLA may form an etched opening 550 on the mold insulation layer 530. Owing to an electron shading effect, the quantity of electrons incident into the etched opening 550 may be smaller than that of the cations PI. The cations PI may therefore accumulate on a floor surface of the etched opening 550. As the etched opening 550 becomes deeper, the quantity of cations that can reach the floor surface of the etched opening 550 may decrease or the cations may not be vertically incident toward the mold insulation layer 530. As a result, an etch rate may be reduced with an increase of etch depth. It thus may be impossible to form the etched opening 550 having an aspect ratio of more than about 50:1. Moreover, owing to the cations not incident vertically toward the mold insulation layer 530, there may occur defects such as a bending, a necking, or the like.

Figure 15:
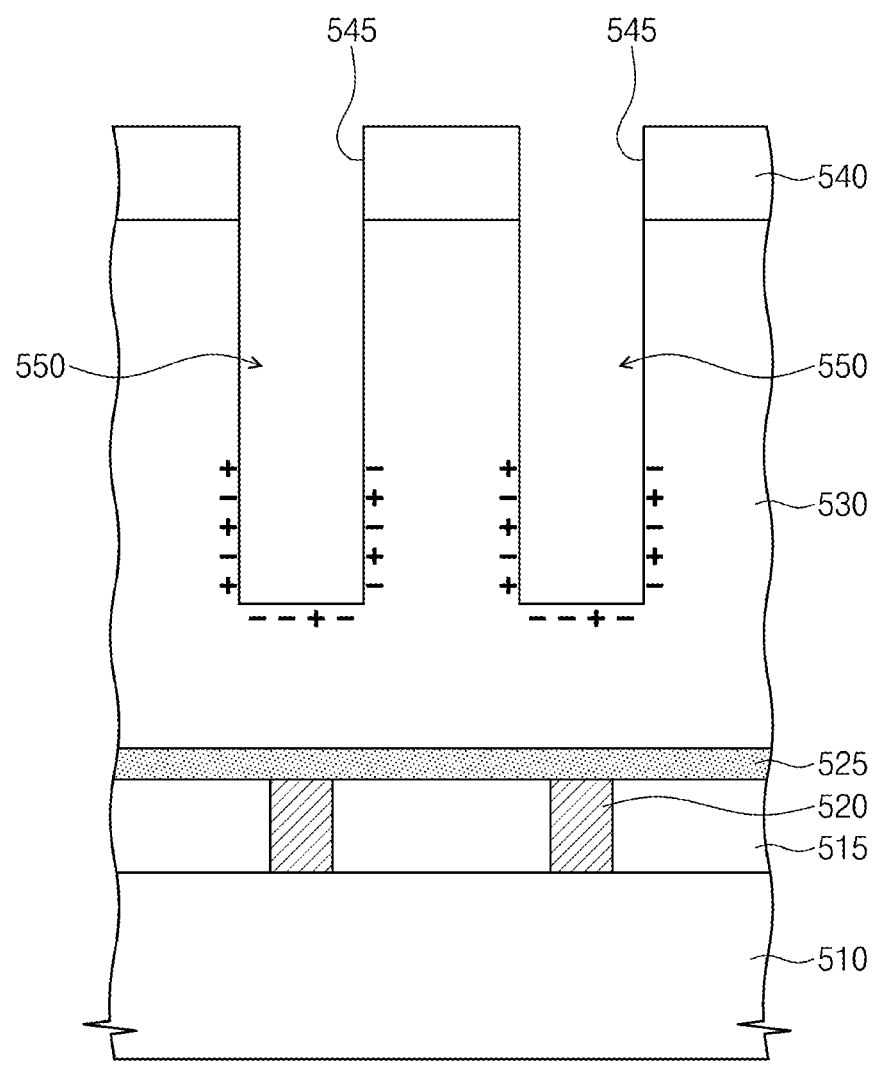

Referring to FIG. 15, the first to fourth RF powers may be turned off and thus no plasma PLA may be generated. The cations PI in the plasma PLA may then not be incident into the etched opening 550. The accumulated cations PI on the etched opening 550 may attract the electrons toward the substrate 510 from the plasma PLA remaining within the chamber 100. The incident electrons toward the substrate 510 may neutralize the accumulated cations on the floor surface of the etched opening 550.

Figure 16:
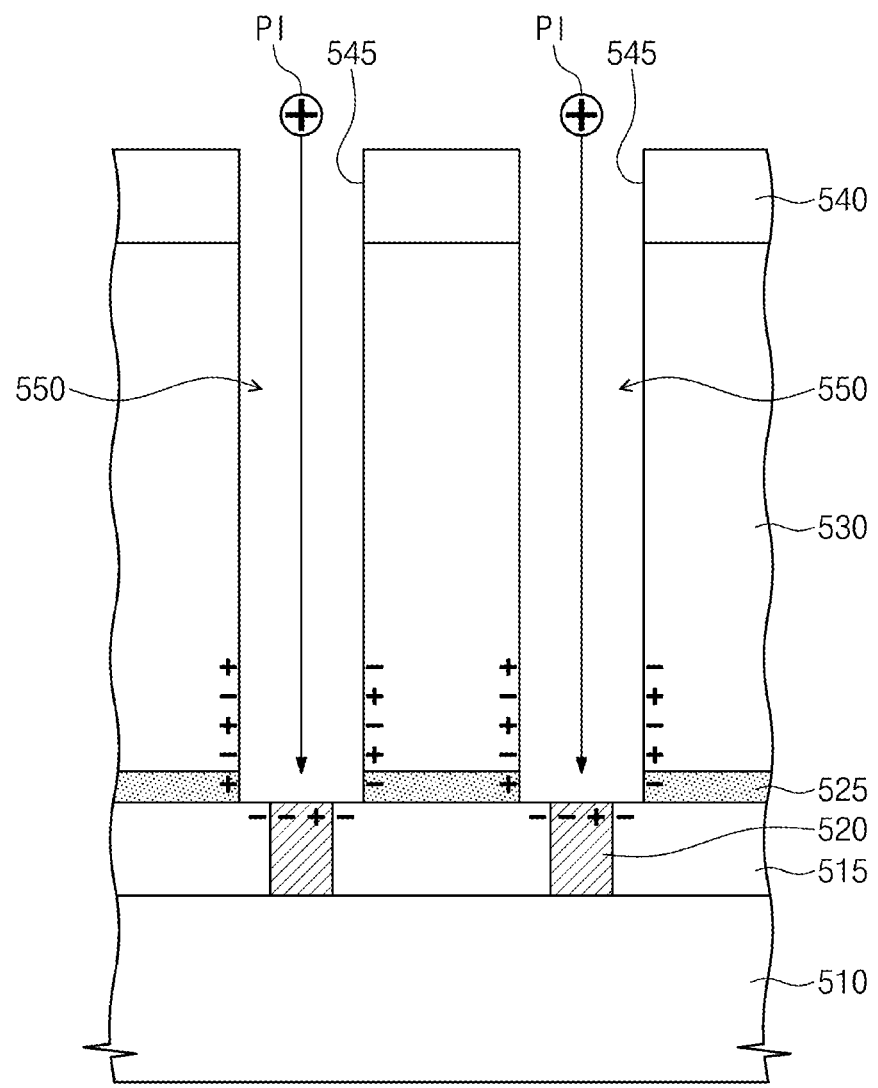

Referring to FIG. 16, the first to fourth RF powers may be turned on again. The plasma may then be regenerated within the chamber 100. Cations PI in the regenerated plasma may be incident into the etched opening 550 of the mold insulation layer 530. Accordingly, the mold insulation layer 530 may be etched such that the etched opening 550 may become deeper.

This cyclically repetitive turn-on/off duration may form the etched opening 550 having a high aspect ratio in the mold insulation layer 530. The incident cations PI may further remove the etch stop layer 525 below the mold insulation layer 530, which may result in exposing the contact plugs 520.

Figure 17:
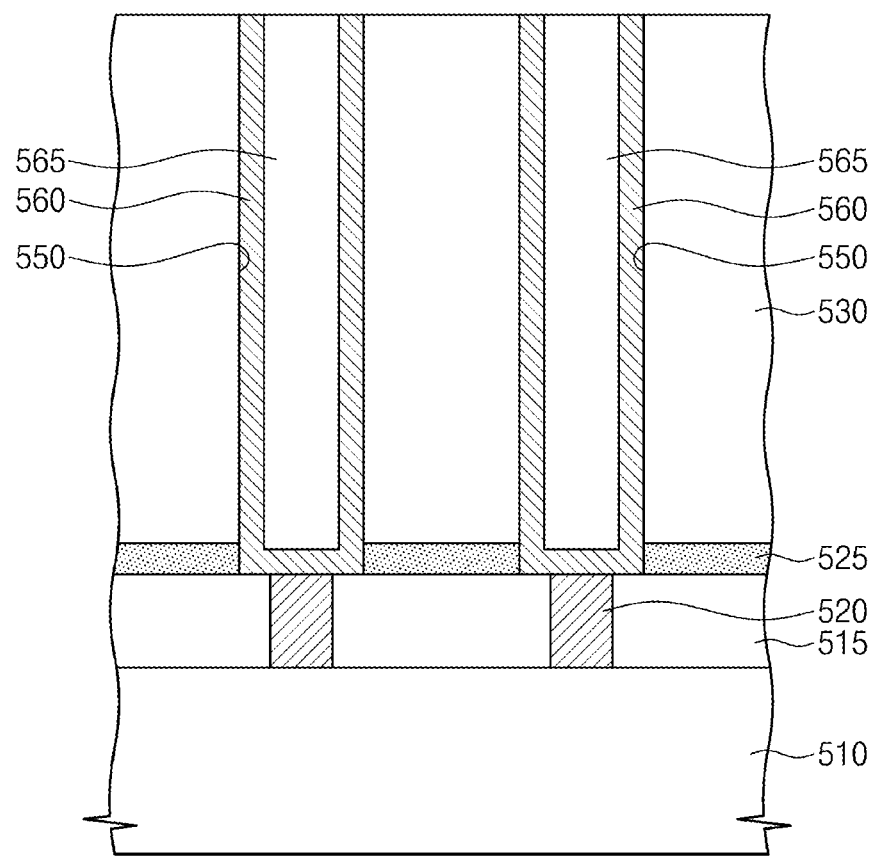

Referring to FIG. 17, the mask layer 540 may be removed from on the mold insulation layer 530. A lower electrode layer may be conformally formed on the substrate 510 having the etched opening 550 formed thereon, and a filling layer may be formed on the mold insulation layer 530 to completely fill the etched opening 550. The filling layer and the lower electrode layer may be planarized until the mold insulation layer 530 is exposed. Accordingly, a lower electrode 560 and a filling pattern 565 may be formed in the etched opening 550. The lower electrode 560 may have a cylindrical shape. Alternatively, in other example embodiments, the lower electrode layer may be only formed without the formation of the filling layer. In this case, the lower electrode 560 may have a pillar shape.

Figure 18:
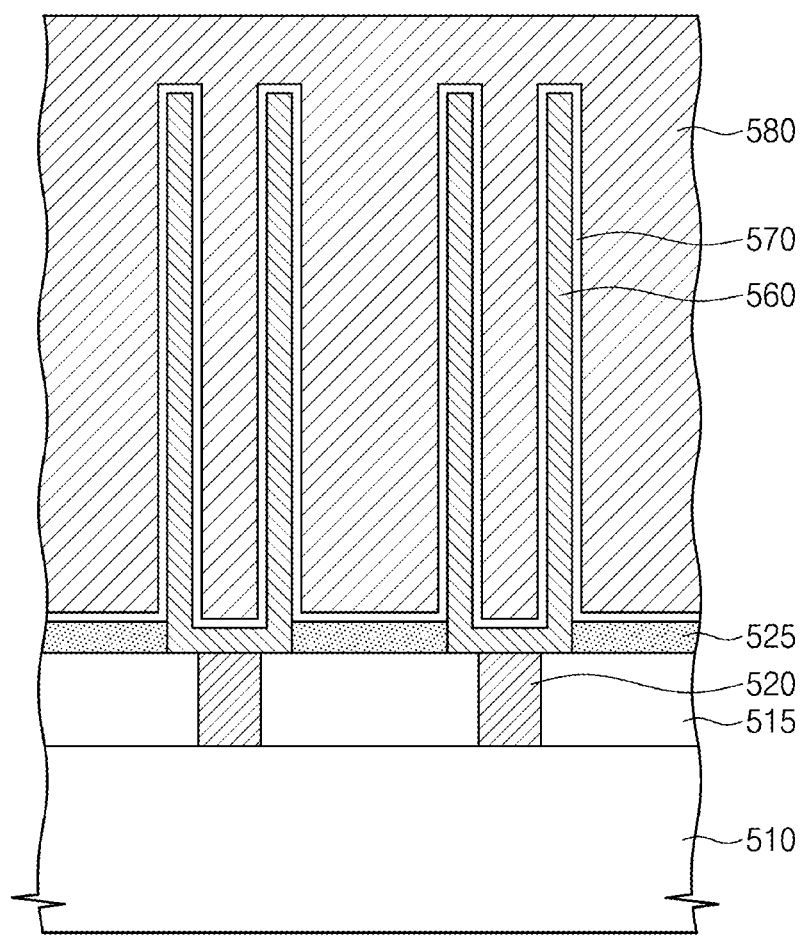

Referring to FIG. 18, the filling pattern 565 and the mold insulation layer 530 may be removed to expose a surface of the lower electrode 560. A capacitor dielectric layer 570 may be formed on the exposed surface of the lower electrode 560. An upper electrode 580 may be formed on the capacitor dielectric layer 570 to cover a surface of the capacitor dielectric layer 570. The lower electrode 560, the capacitor dielectric layer 570, and the upper electrode 580 may constitute a capacitor.

FIGS. 19 to 29 are cross-sectional views illustrating a method of fabricating a semiconductor device using a method of plasma etching according to some example embodiments of inventive concepts. FIGS. 19 to 29 show an etching of an etching target using the plasma etching apparatus of FIG. 11, but the present inventive concept is not limited thereto; for example, the plasma etching apparatus of FIG. 1 may be employed. It will be hereinafter explained a process for fabricating a semiconductor device with reference to FIGS. 11 and 12.

Figure 19:
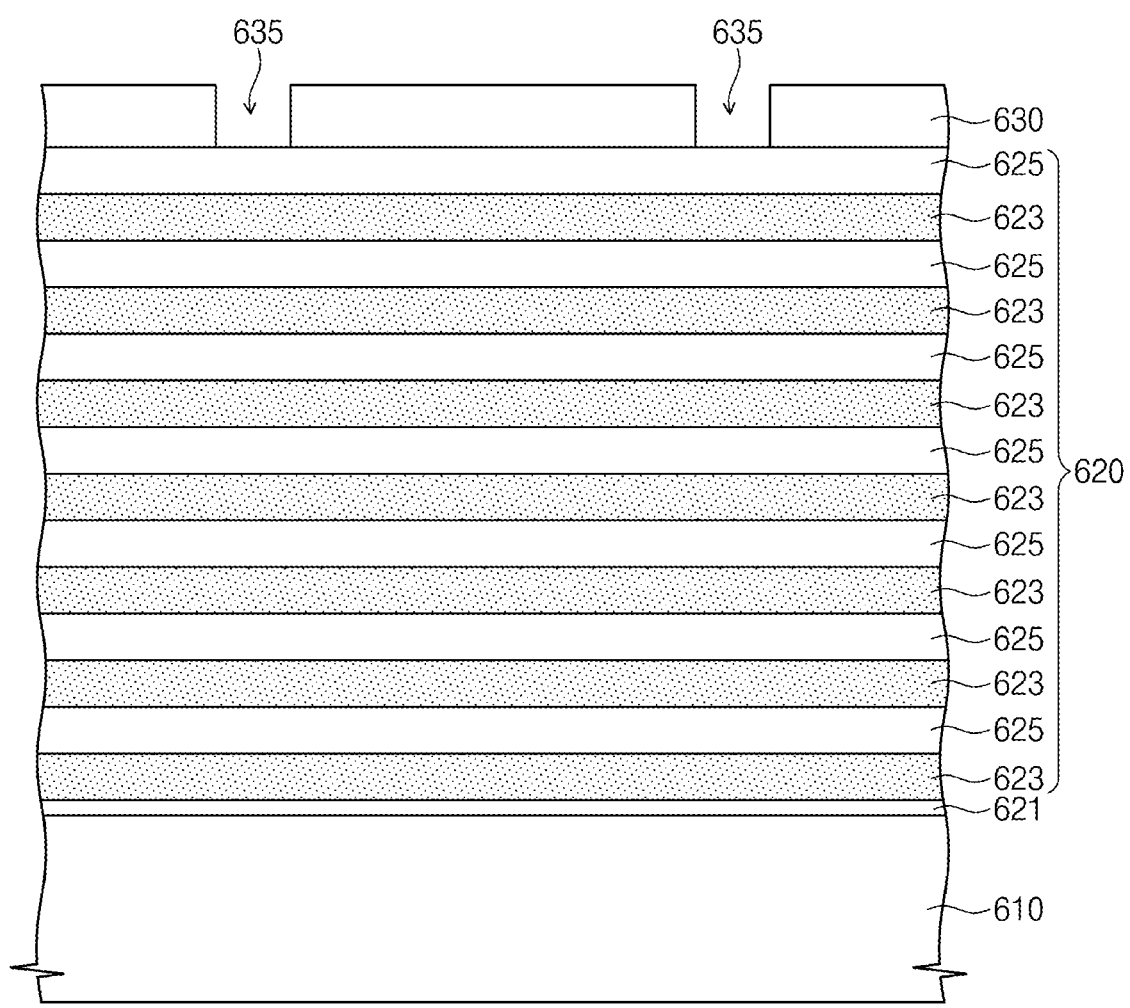
FIGS. 19 to 29 are cross-sectional views illustrating a method of fabricating a semiconductor device using a plasma etching method according to some example embodiments of inventive concepts.

Referring to FIG. 19, a mold insulation layer 620 may be formed on a substrate 610. The mold insulation layer 620 may include first layers 623 and second layers 625 alternately and repeatedly stacked. The second layers 625 may include an insulating material. The first layers 623 may include a material having an etch selectivity to the second layers 625. For example, the second layers 625 may include a silicon oxide layer and the first layers 623 may include a silicon nitride layer. The mold insulation layer 620 may further include a buffer insulation layer 621. The buffer insulation layer 621 may be disposed between the substrate 610 and a lowermost one of the first layers 623. The buffer insulation layer 621 may include a silicon oxide layer.

A mask layer 630 may be formed on the mold insulation layer 620. The mask layer 630 may include at least one mask opening 635. The mask opening 635 may expose a portion of the mold insulation layer 620.

Figure 20:
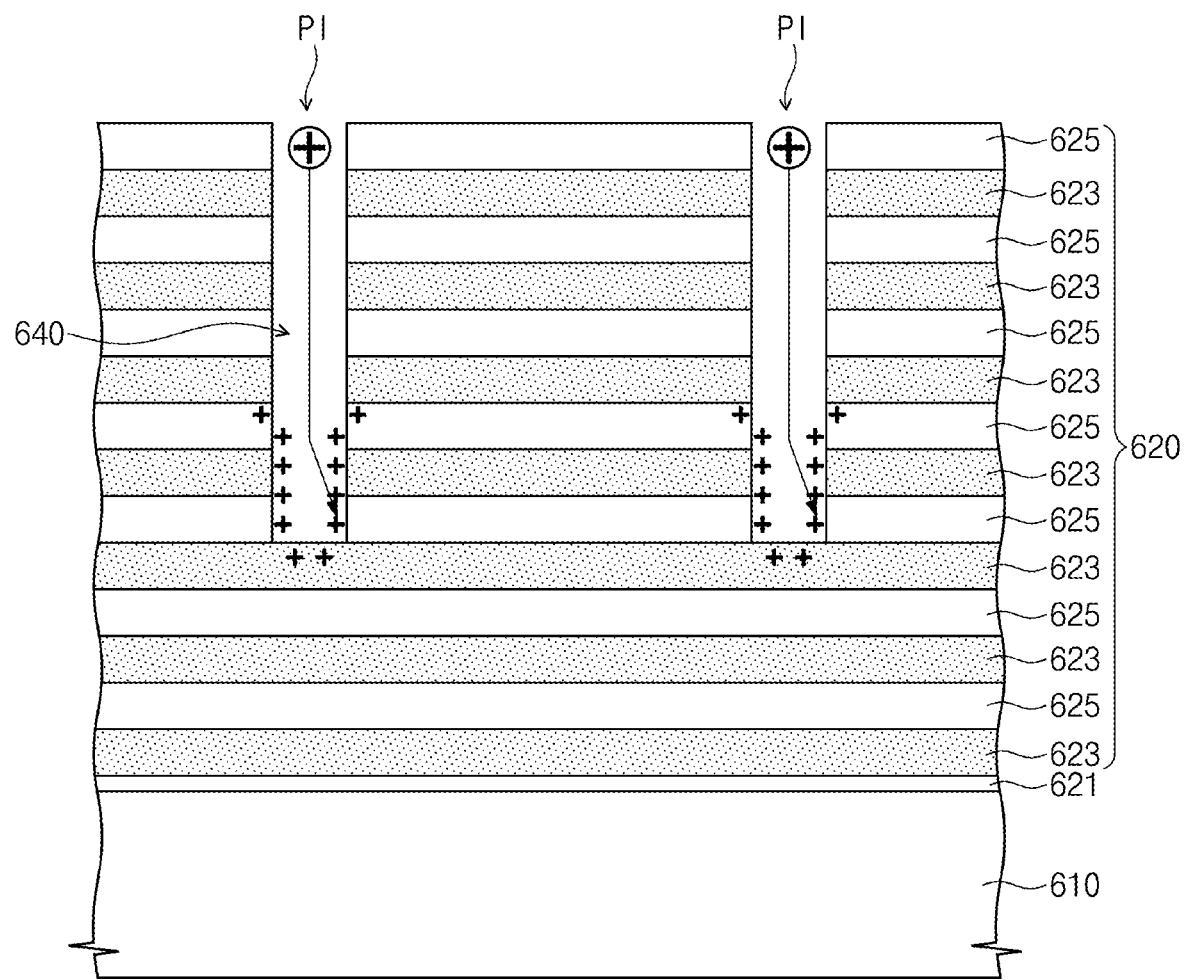

Referring to FIG. 20, the substrate 610 having an etching target formed thereon may be loaded on the first electrode 110 within the chamber 100. The first electrode 110 may be supplied with a plurality of RF powers to generate plasma PLA and thus cations PI in the plasma PLA may be incident toward the substrate 610. The second electrode 120 may be supplied with a DC power. Accordingly, electrons remaining within the chamber 100 may be incident toward the substrate 610. In some example embodiments, the etching target may include the mold insulation layer 620.

When the first electrode 110 is supplied with the plurality of RF powers, the plasma PLA may be generated from a process gas. Cations PI in the plasma PLA may accelerate into the substrate 610 on the first electrode 110. The accelerated cations PI into the substrate 610 may be incident toward the mold insulation layer 620 on the substrate 610 after passing through the mask opening 635 of the mask layer 630. The mold insulation layer 620 may be etched by the cations PI incident thereonto. Accordingly, the cations PI in the plasma PLA may form an etched opening 640 in the mold insulation layer 620.

Figure 21:
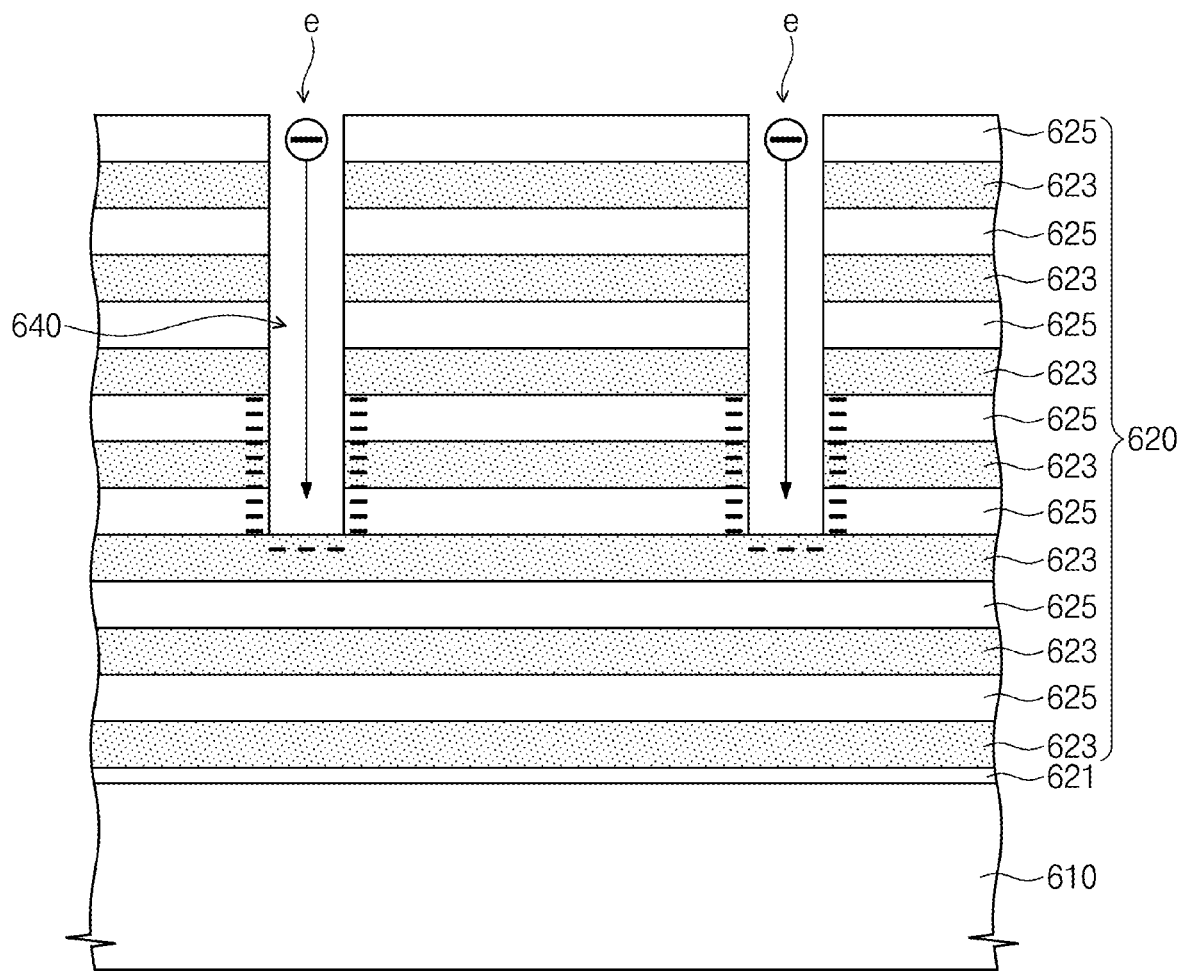

Referring to FIG. 21, the first to fourth RF powers may be turned off and thus no plasma PLA may be generated. The cations PI in the plasma PLA may then not be incident into the etched opening 640, thereby neutralizing the cations accumulated on a floor surface of the etched opening 640. In some example embodiments, the etched opening 640 may be vertical to the substrate 610.

A negative DC power may be turned on in synchronization with the turns-off of the first to fourth RF powers. For example, a voltage of the negative DC power may increase. The increased negative DC power may accelerate the cations PI remaining within the chamber 100 toward the second electrode 120. The increased negative DC power may also accelerate the electrons e remaining within the chamber 100 toward the first electrode 110. The accelerated electrons e may be incident into the etched opening 640. Accordingly, the cations accumulated on the floor surface of the etched opening 640 may be neutralized.

Figure 22:
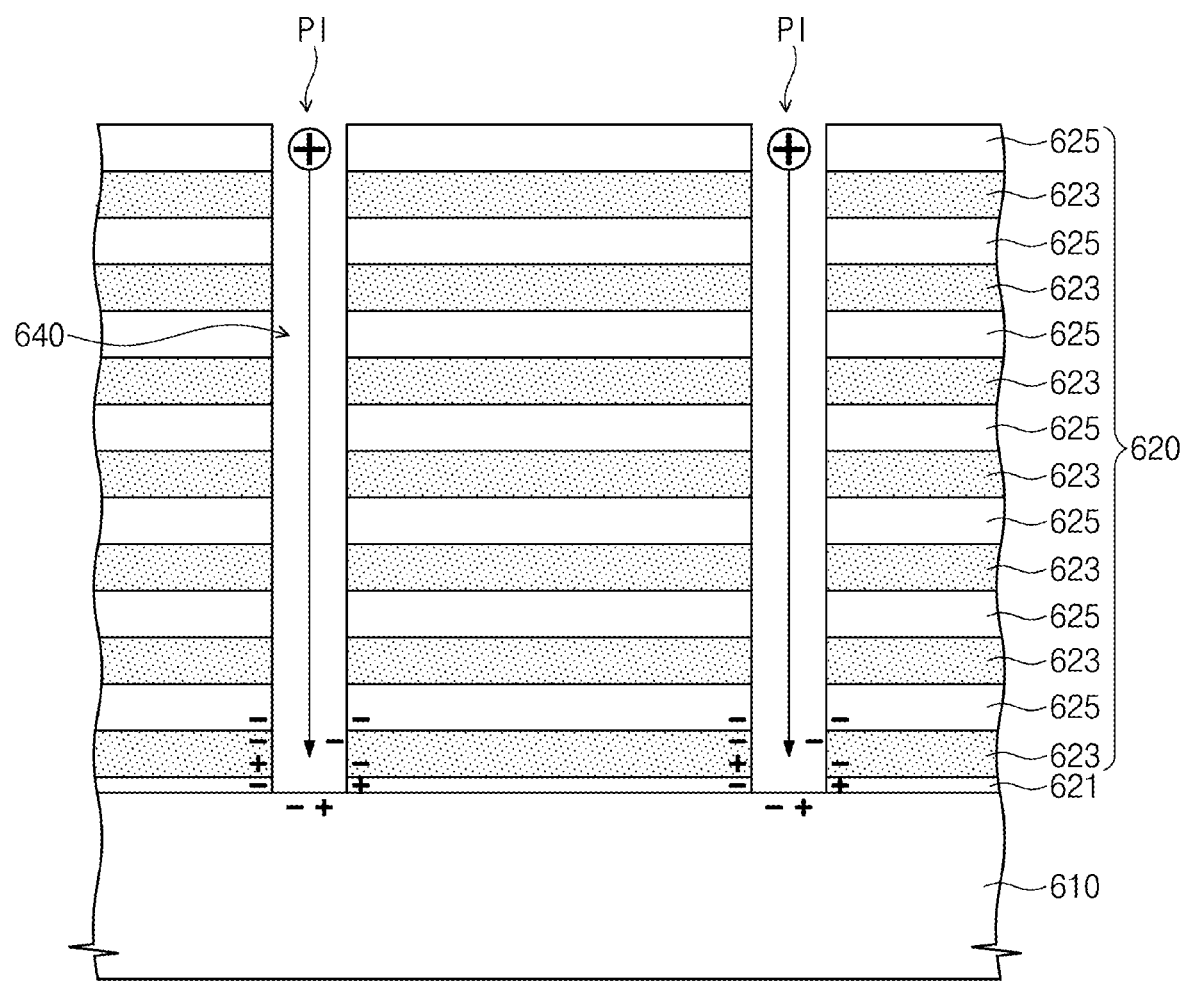

Referring to FIG. 22, the first to fourth RF powers may be turned back on and thus the plasma may be regenerated. The negative DC power may be turned off in synchronization with the turns-on of the first to fourth RF powers. The voltage of the negative DC power may decrease. Cations PI in the regenerated plasma may then be incident toward the etched opening 640 formed in the mold insulation layer 620. In other words, the re-incident cations may travel toward the neutralized floor surface of the etched opening 640. As a result, the etching action may be again performed on the mold insulation layer 620.

This cyclically repetitive turn-on/off duration may form the etched opening 640 having a high aspect ratio in the mold insulation layer 620. For example, the etched opening 640 may be formed to have an aspect ratio of more than about 50:1 in the mold insulation layer 620.

Figure 23:
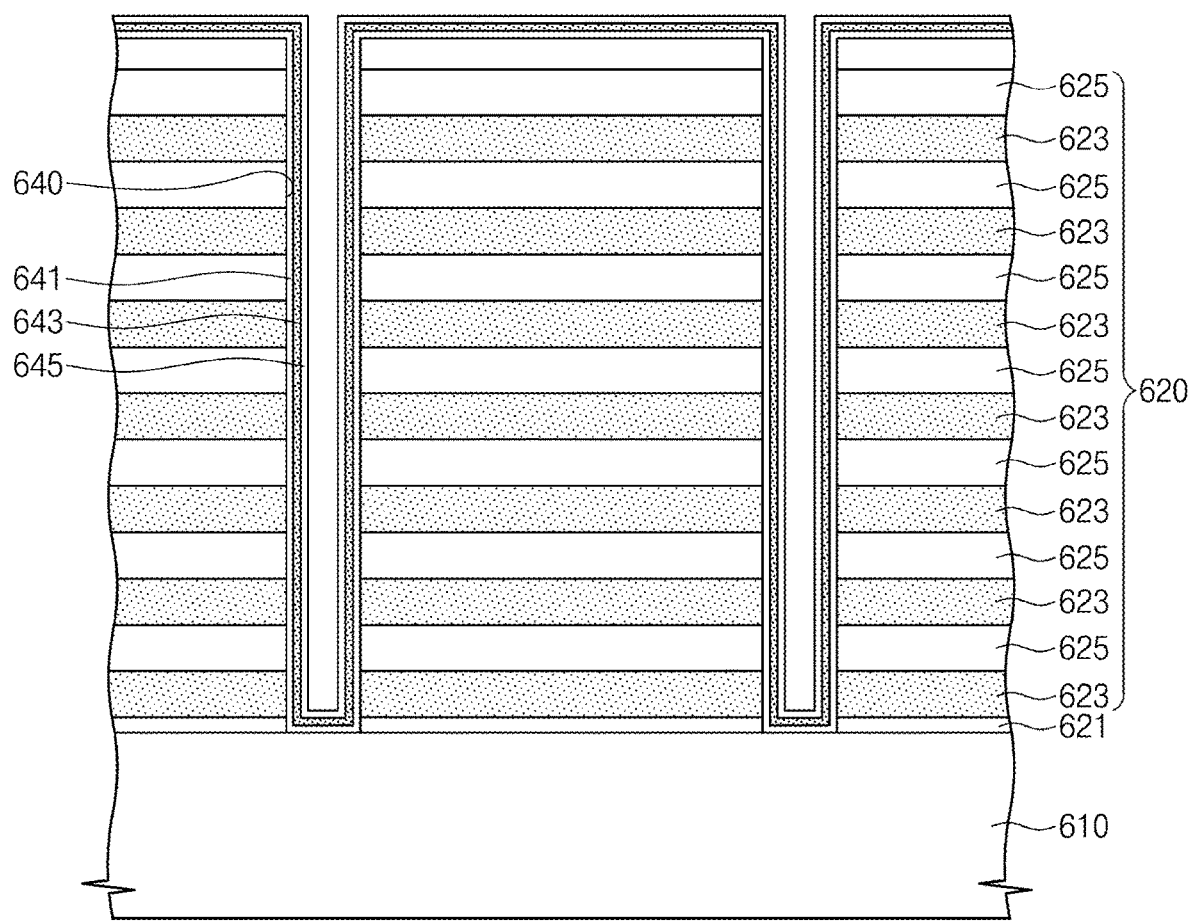

Referring to FIG. 23, a data storage layer 641, a first semiconductor layer 643, and a protection layer 645 may be sequentially formed on the substrate 610. Each of the data storage layer 641, the first semiconductor layer 643, and the protection layer 645 may be disposed on an inner sidewall of the etched opening 640. Each of the data storage layer 641, the first semiconductor layer 643, and the protection layer 645 may have substantially the same thickness along its length. The data storage layer 641, the first semiconductor layer 643, and the protection layer 645 may partially fill the etched opening 640.

In some example embodiments, the data storage layer 641 may include a first blocking insulation layer, a charge storage layer, and a tunnel insulation layer sequentially stacked on one another. The tunnel insulation layer may be a silicon oxide layer. The charge storage layer may include a trap insulation layer having trap sites or may include an insulation layer having conductive nano-dots. The first blocking insulation layer may include an insulating material having an energy band gap greater than that of the charge storage layer. For example, the first blocking insulation layer may include a silicon oxide layer.

The first semiconductor layer 643 may be formed of a semiconductor material (e.g., silicon). The first semiconductor layer 643 may have an amorphous or crystalline state. The first semiconductor layer 643 may have an undoped state or may be doped with a dopant having the same conductivity as that of the substrate 610. The protection layer 645 may protect the first semiconductor layer 643 in a subsequent process. The protection layer 645 may include a silicon oxide layer.

Figure 24:
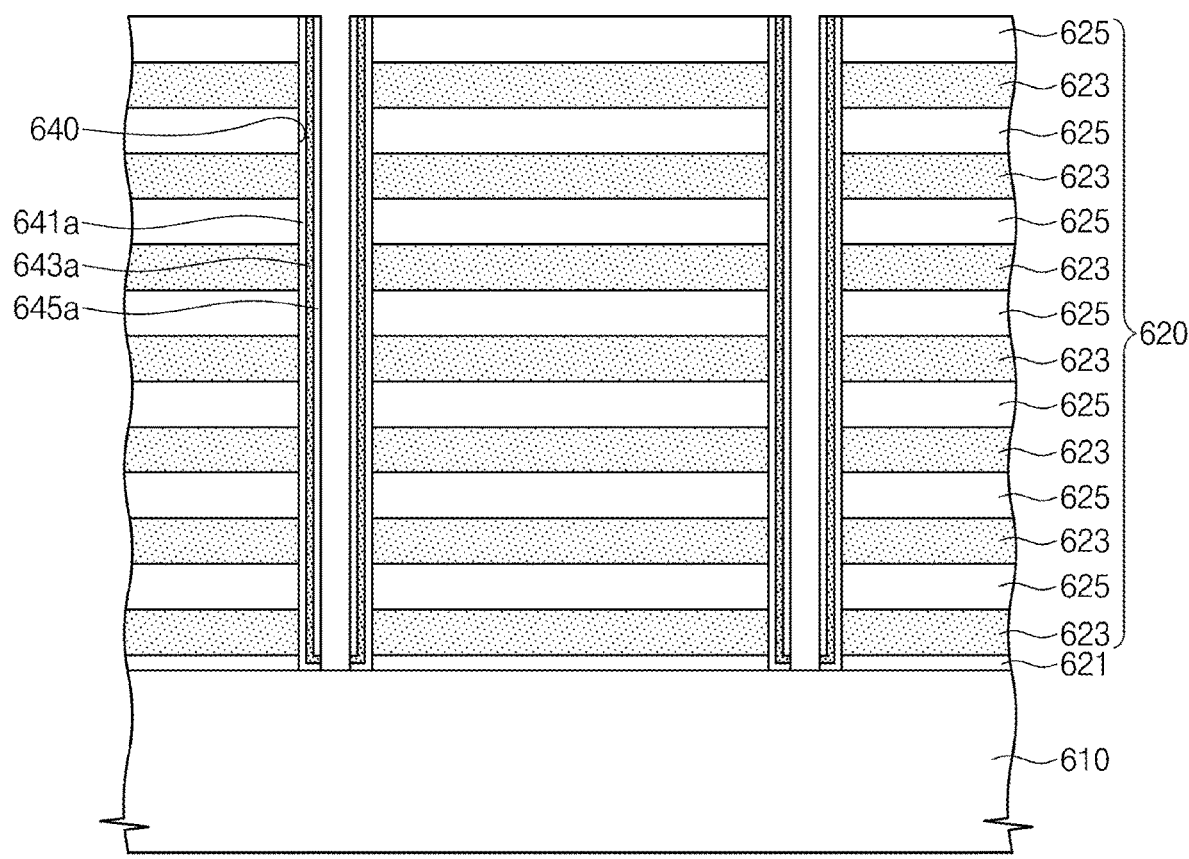

Referring to FIG. 24, the protection layer 645, the first semiconductor layer 643, and the data storage layer 641 may be successively etched. Accordingly, an upper portion of the substrate 610 may be exposed. The successive etching may form a data storage pattern 641a, a first semiconductor pattern 643a, and a protection pattern 645a sequentially disposed on the inner sidewall of the etched opening 640. Each of the patterns 641a, 643a and 645a may have a cylindrical shape whose top and bottom ends are opened. A dry etching process may be employed to etch the layers 641, 643 and 645. For example, the plasma etching apparatus 11 may be used to etch the layers 641, 643 and 645.

In some example embodiments, the protection layer 645 may be formed of a material different from those of the data storage layer 641 and the first semiconductor layer 643. As a result, after the protection layer 645 is etched, a different kind of process gas may be introduced into the chamber 100. The plasma etching apparatus 11 may use the different kind of process gas to etch the first semiconductor layer 643. Thereafter, other different kind of process gas may be introduced into the chamber 100. The plasma etching apparatus 11 may use the other different kind of process gas to etch the data storage layer 641. The layers 641, 643 and 645 may be etched to form the patterns 641a, 643a and 645a. After the patterns 641a, 643a and 645a are formed, the substrate 610 may be unloaded from the first electrode 110.

Figure 25:
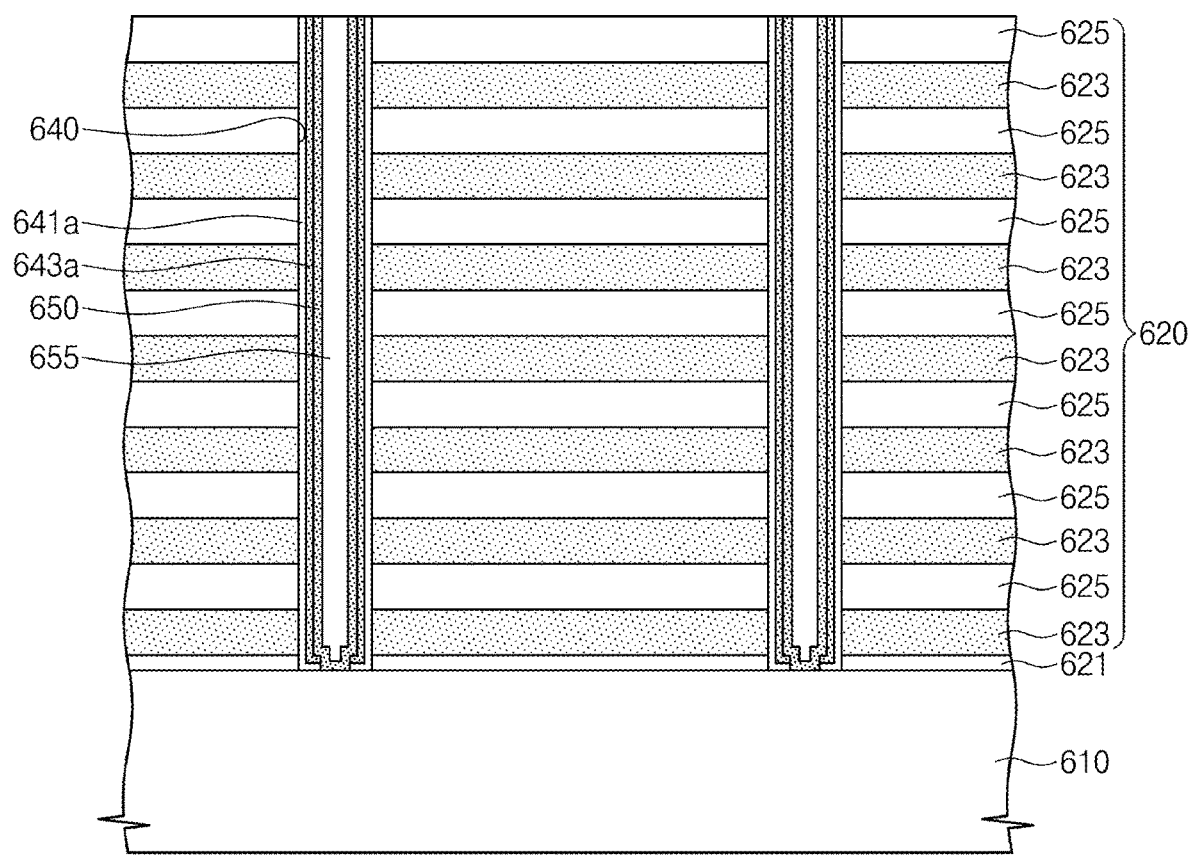

Referring to FIG. 25, an isotropic etching process (e.g., a wet etching process) may be performed to etch the protection pattern 645a. Accordingly, the first semiconductor pattern 643a may be exposed. A second semiconductor layer may be conformally formed on the substrate 610. A filling insulation layer may be formed on the second semiconductor layer such that the etched opening 640 may be filled with the filling insulation layer. A planarization process may be performed on the filling insulation layer and the second semiconductor layer. Therefore, a second semiconductor pattern 650 and a filling insulation pattern 655 may be formed in the etched opening 640. The second semiconductor pattern 650 may be coupled to the first semiconductor pattern 643a and the substrate 610. The first semiconductor pattern 643a may be electrically connected to the substrate 610 through the second semiconductor pattern 650. The first and second semiconductor patterns 643a and 650 may be used as a vertical channel pattern.

Figure 26:
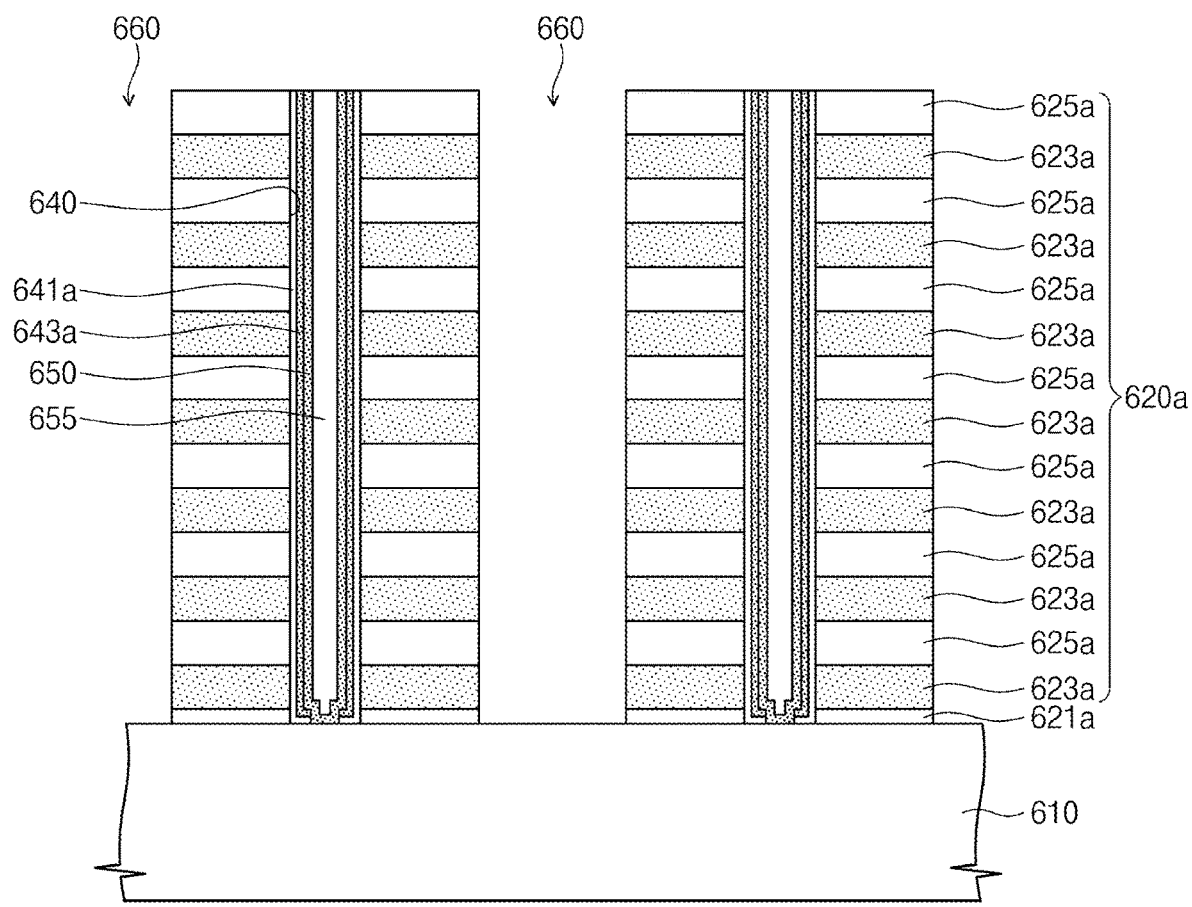

Referring to FIG. 26, the mold insulation layer 620 may be patterned. Therefore, mold patterns 620a may be formed spaced apart from each other across a trench 660. The trench 660 may be provided in plural. The patterning of the mold insulation layer 620 may be performed using the plasma etching apparatus 11 discussed above. The mold pattern 620a may include first patterns 623a and second patterns 625a alternately and repeatedly stacked. The mold pattern 620a may further include a buffer insulation pattern 621a between the substrate 610 and a lowermost one of the first patterns 623a. The trench 660 may expose sidewalls of the first and second patterns 623a and 625a.

Figure 27:
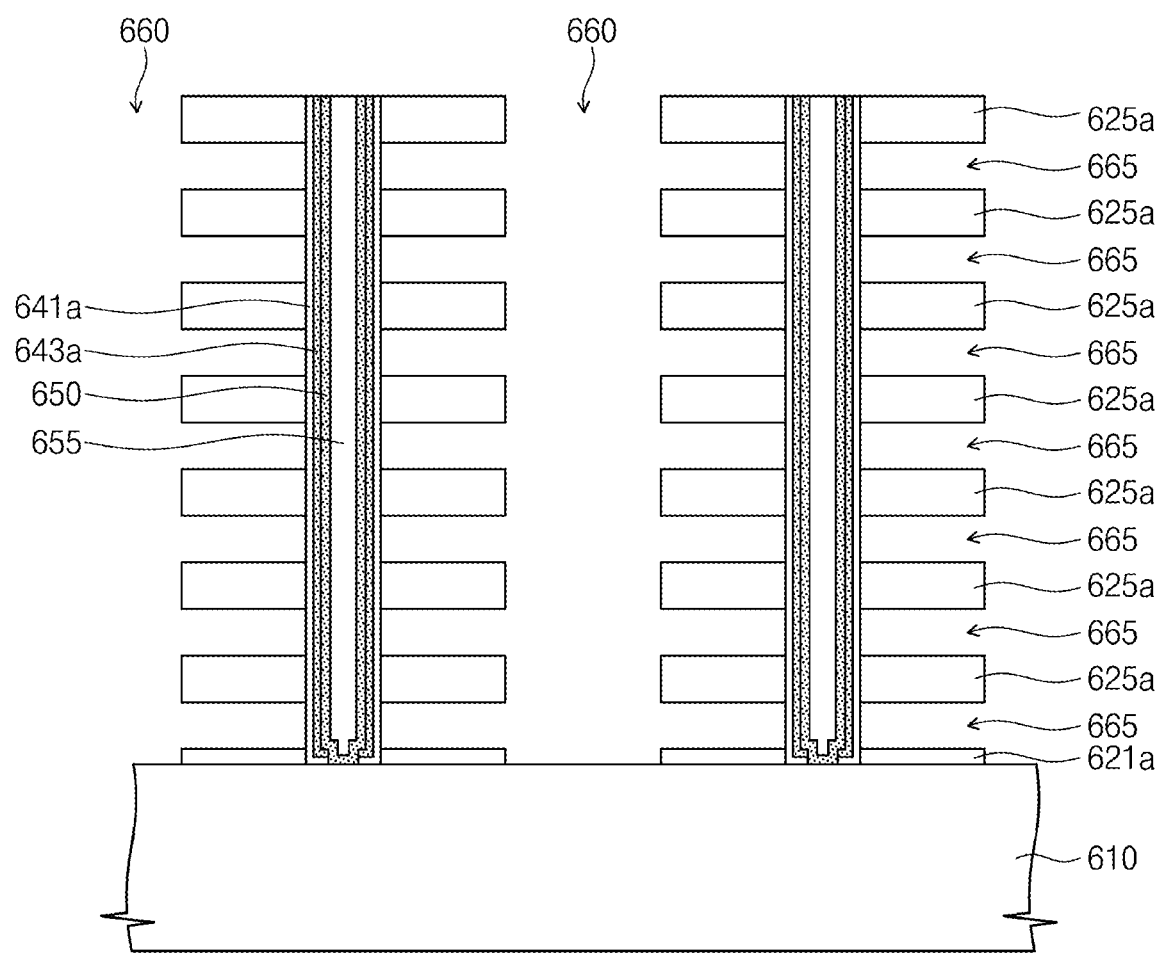

Referring to FIG. 27, an isotropic etching process may be performed to remove the first patterns 623a exposed through the trench 660. A plurality of hollow spaces 665 may thus be formed at regions occupied by the first patterns 623a. The first patterns 623a may have an etch selectivity to the second patterns 625a. Accordingly, when the isotropic etching process is carried out to remove the first patterns 623a, the second patterns 625a may still remain.

Figure 28:
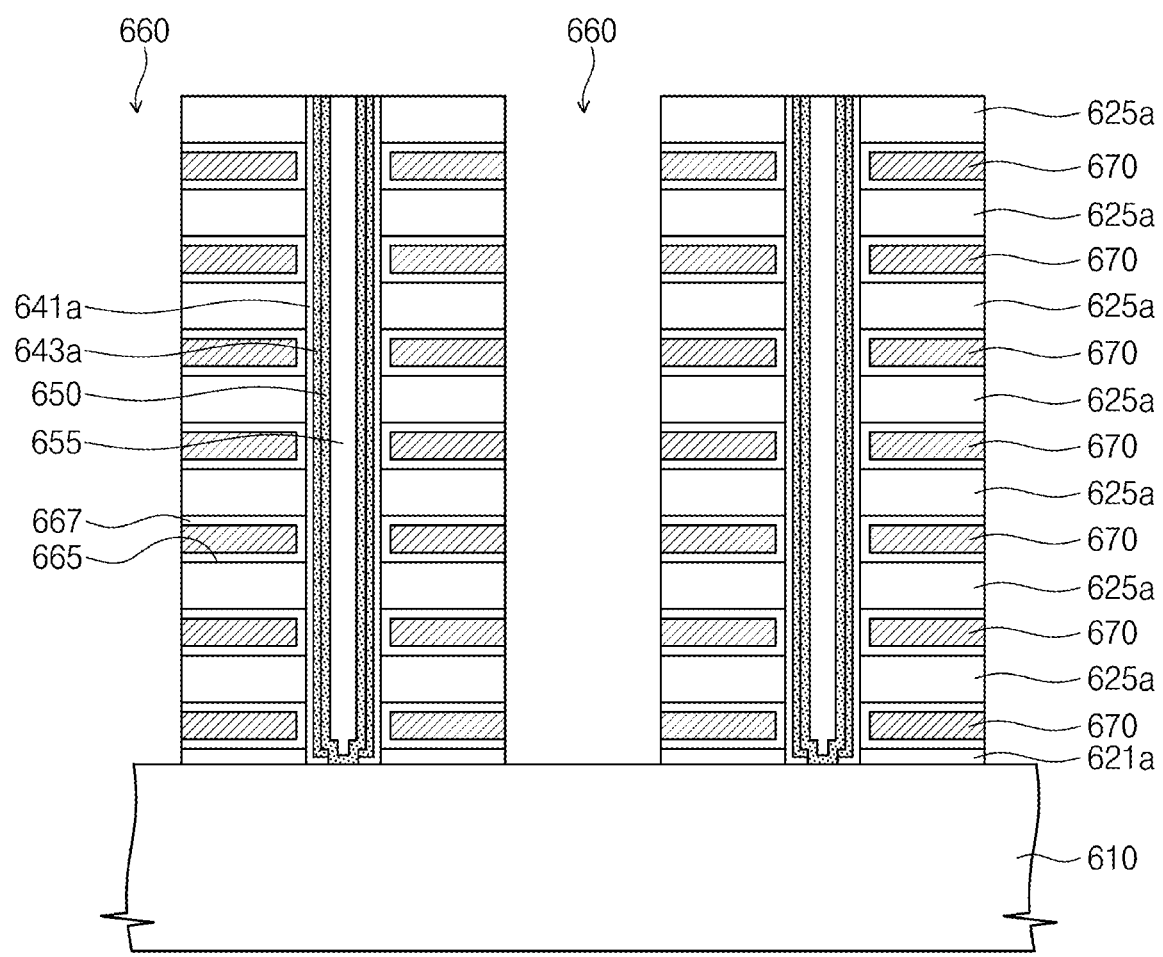

Referring to FIG. 28, second blocking insulation layers 667 may be formed to extend along inner surfaces of the hollow spaces 665, and electrode patterns 670 may be formed to fill the hollow spaces 665. The electrode patterns 670 may serve as gate electrodes. The second blocking insulation layer 667 may be removed outside the hollow space 665. The electrode patterns 670 may include a doped semiconductor material and/or a metal-containing material. The second blocking insulation layers 667 may include a high-k dielectric material whose dielectric constant is greater than that of the tunnel insulation layer. For example, the second blocking insulation layer 667 may include insulating metal oxide such as hafnium oxide and/or aluminum oxide.

Figure 29:
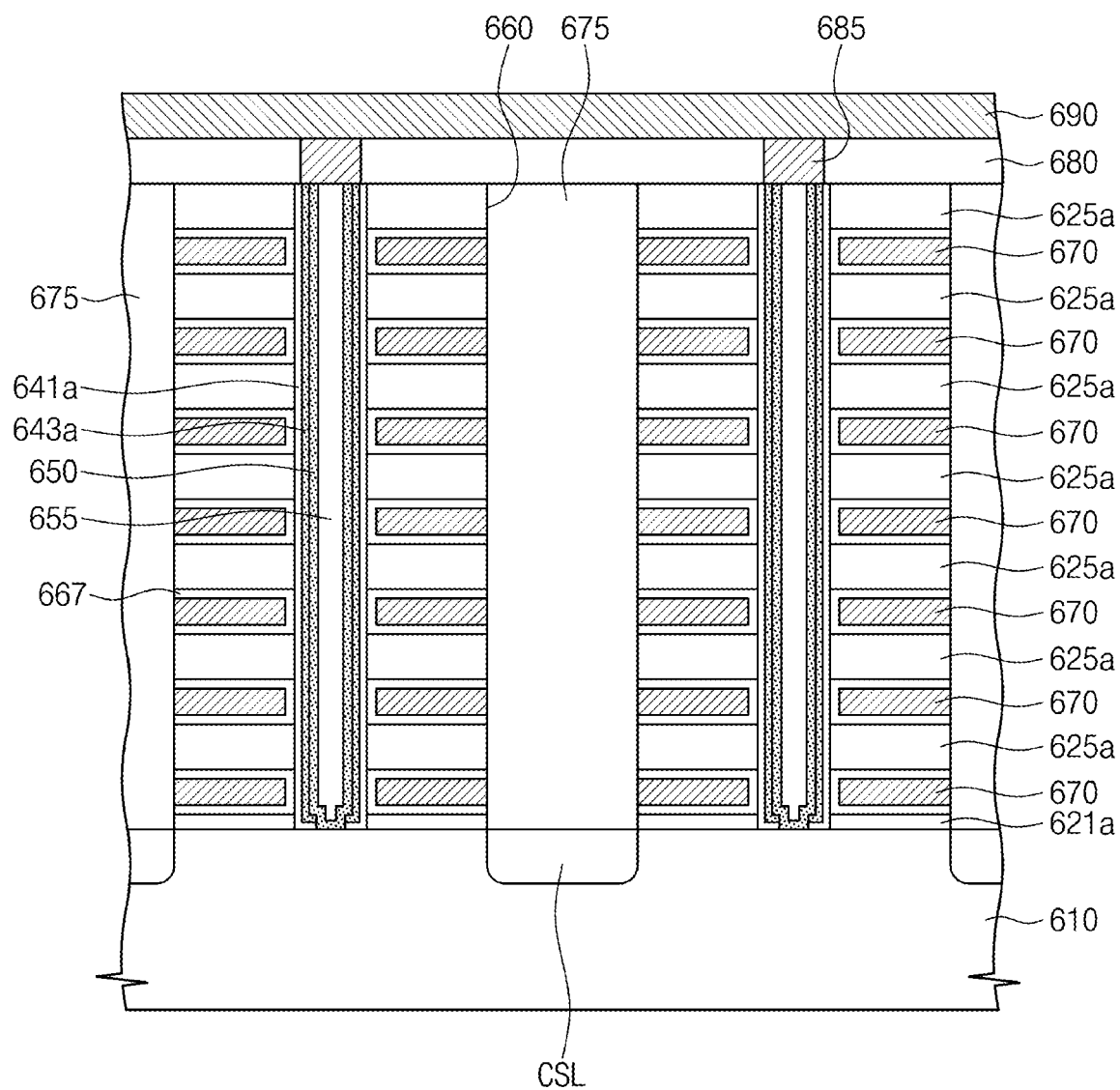

Referring to FIG. 29, dopants may be implanted into the substrate 610 underneath the trench 660. Therefore, a common source region CSL may be formed. A device isolation pattern 675 may be formed to fill the trench 660.

An interlayer dielectric layer 680 may be formed on the substrate 610. A plurality of contact plugs 685 may be formed to penetrate the interlayer dielectric layer 680. The contact plugs 685 may be connected to upper portions of the vertical channel patterns 643a and 650. A bit line 690 may be formed to electrically connect with the vertical channel patterns 643a and 650 through the contact plugs 685. The bit line 690 may be disposed on the interlayer dielectric layer 680.

Figure 30:
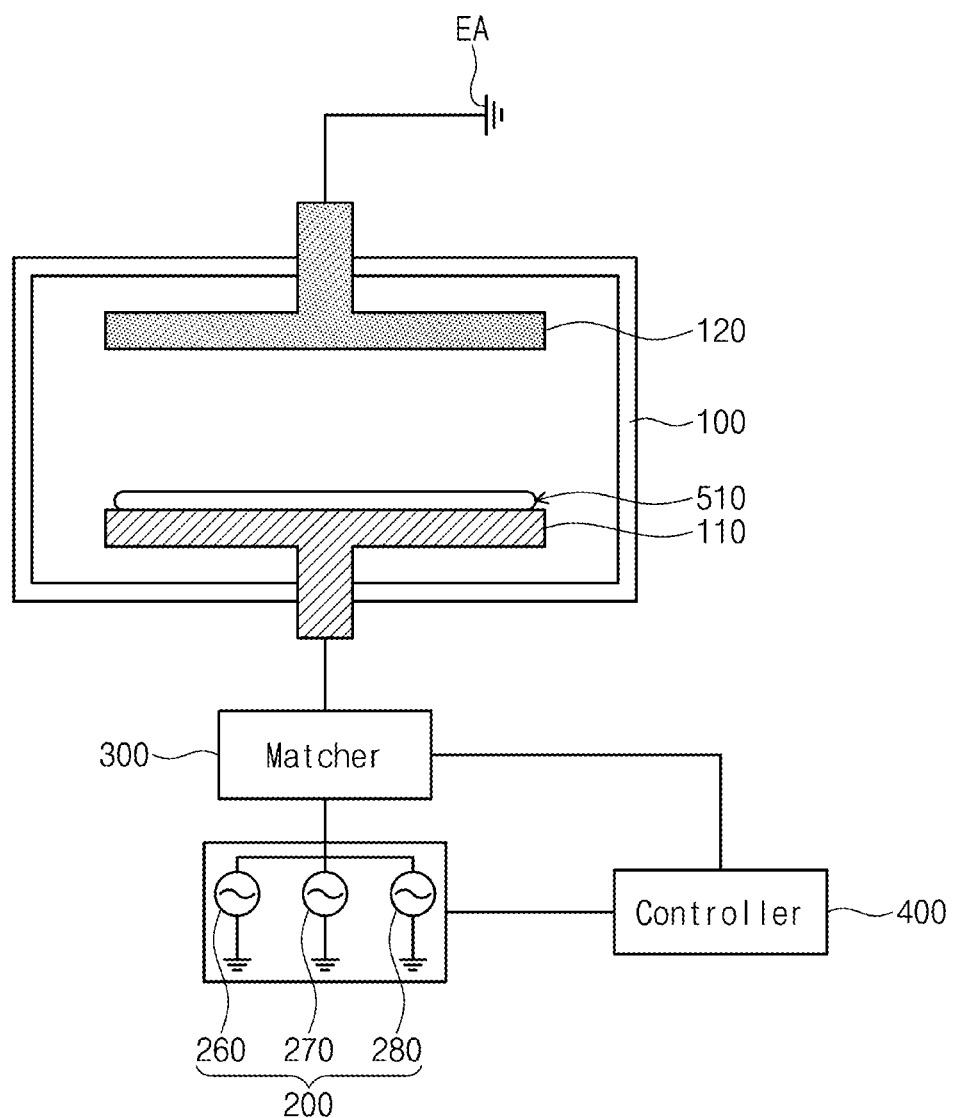
FIG. 30 is a schematic diagram illustrating a plasma etching apparatus according to some example embodiments of inventive concepts.
Figure 31:
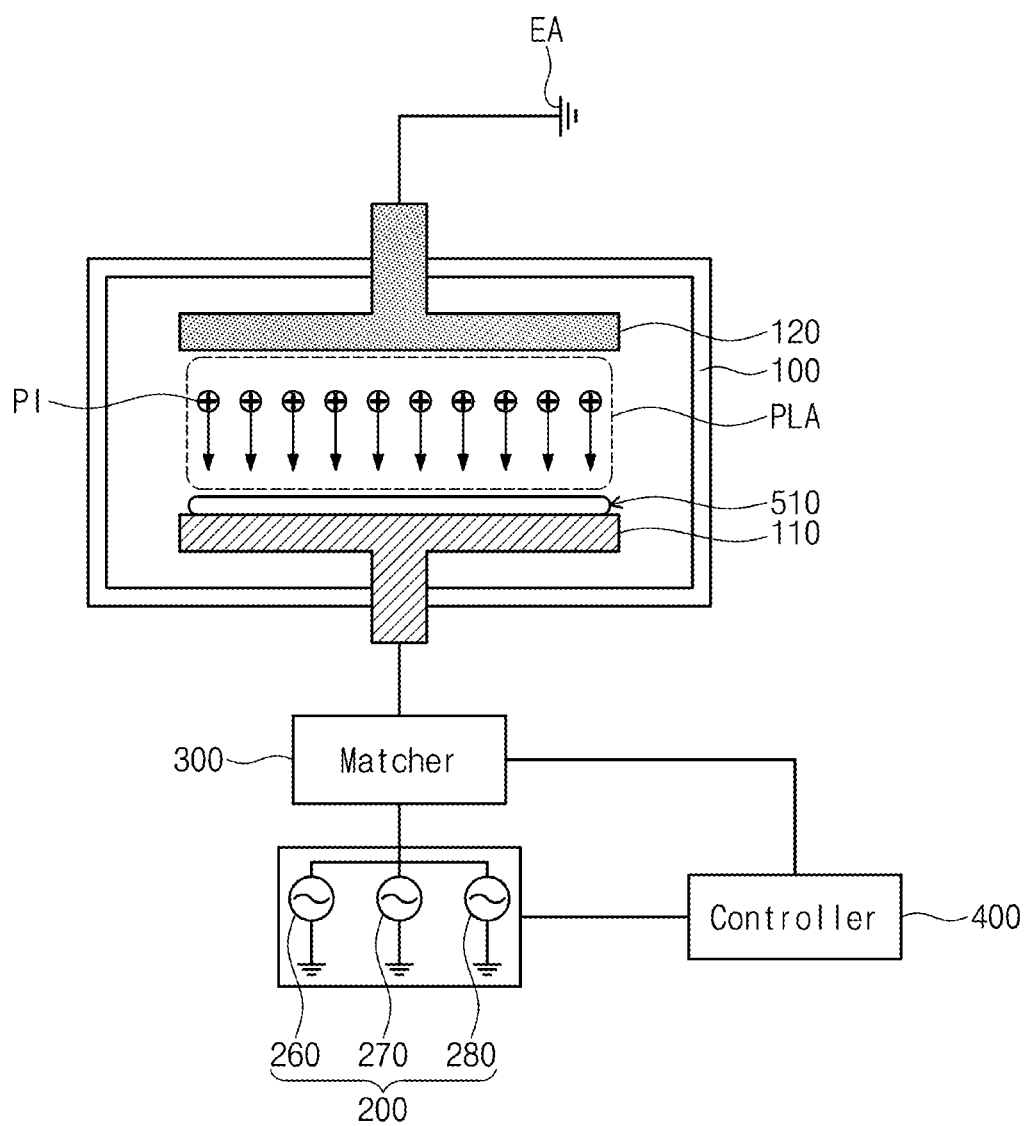
FIG. 31 is a schematic diagram illustrating a plasma etching process conducted in the plasma etching apparatus of FIG. 30.

FIG. 30 is a schematic diagram illustrating a plasma etching apparatus 20 according to some example embodiments of inventive concepts. FIG. 31 is a schematic diagram illustrating a plasma etching process conducted in the plasma etching apparatus 20 of FIG. 30. In the embodiment that follows, component substantially the same as those of the plasma etching apparatus 10 discussed with reference to FIG. 1 are allocated the same reference numerals thereto, and a repetitive explanation thereof may be omitted in the interest of brevity of the description. Referring to FIGS. 30 and 31, a plasma etching apparatus 20 according to some example embodiments of inventive concepts may include a RF power supply unit 200, which has a first RF power supply 260, a second RF power supply 270, and a third RF power supply 280. Accordingly, the RF power supply unit 200 may apply a plurality of RF powers to a first electrode 110, but the present inventive concept is not limited to, for example, the RF power supply unit 200 may apply a plurality of RF powers to one of the first electrode 110 and the second electrode 120.

The first RF power supply 260 may supply a first RF power having a first frequency. The first frequency may be in the range from about 40 MHz to about 300 MHz. In some example embodiments, the first frequency may be about 60 MHz. The first RF power supply 260 may be a source RF power supply that applies a source RF power, and the first RF power may generate plasma PLA in a chamber 100. In other words, when the first RF power is applied to the first electrode 110, the plasma PLA may be generated from a process gas introduced into the chamber 100. The first RF power supply 260 may supply the first RF power in the range of about 0 W to about 10000 W. For example, the first RF power supply 260 may provide power of about 2400 W, but not limited thereto.

The second RF power supply 270 may supply a second RF power having a second frequency. The second frequency may be less than the first frequency. The second frequency may be in the range from about 100 kHz to about 10 MHz. The second frequency may be in the range of more than about 100 kHz and less than about 10 MHz. In some example embodiments, the second frequency may be about 9.8 MHz. The second RF power supply 270 may be a bias RF power supply, and the second RF power may cause cations PI incident onto a substrate 510. The second RF power supply 270 may supply the second RF power in the range of about 0 W to about 10000 W. For example, the second RF power supply 270 may provide power of about 2500 W, but not limited thereto.

The third RF power supply 280 may supply a third RF power having a third frequency. The third frequency may be less than at least one of the first and second frequencies. The third frequency may be in the range from about 10 kHz to about 5 MHz. In some example embodiments, the third frequency may be about 400 kHz. The third RF power supply 280 may be a bias RF power supply, and the third RF power may cause the cations PI incident onto the substrate 510. The third RF power may be greater than the first and second RF powers. The third RF power supply 280 may supply the third RF power in the range of about 0 W to about 50000 W. For example, the third RF power supply 280 may provide power of about 9000 W, but not limited thereto. In this description, the first to third frequencies may be a radio frequency (RF).

Figure 32A:
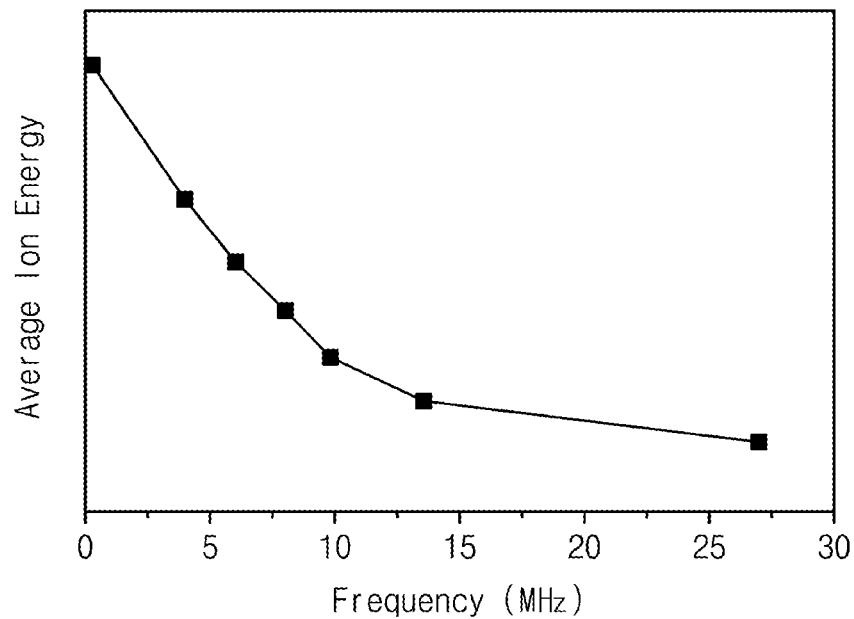
FIG. 32A is a graph showing an average ion energy in accordance with a RF frequency combination.
Figure 32B:
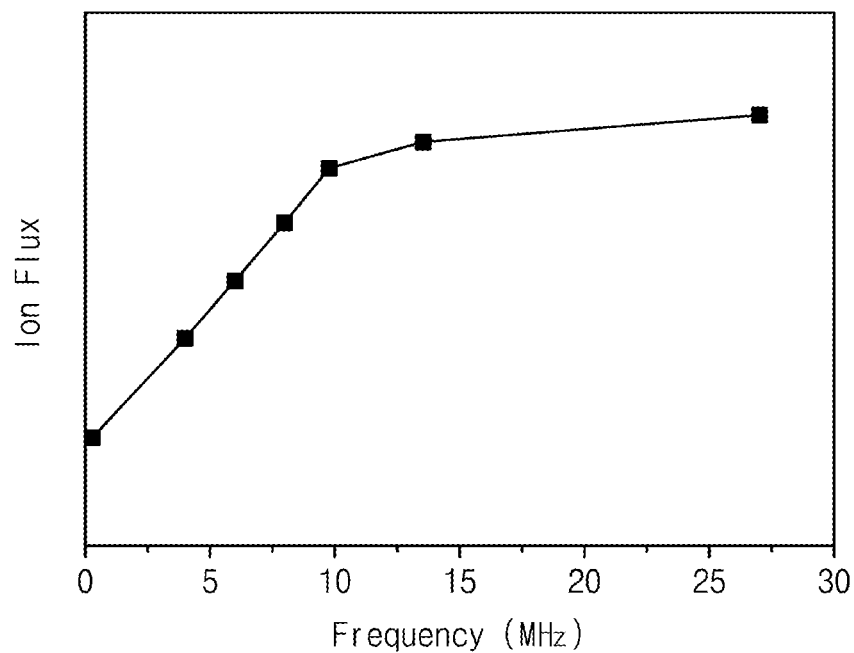
FIG. 32B is a graph showing an ion flux in accordance with a RF frequency combination.
Figure 32C:
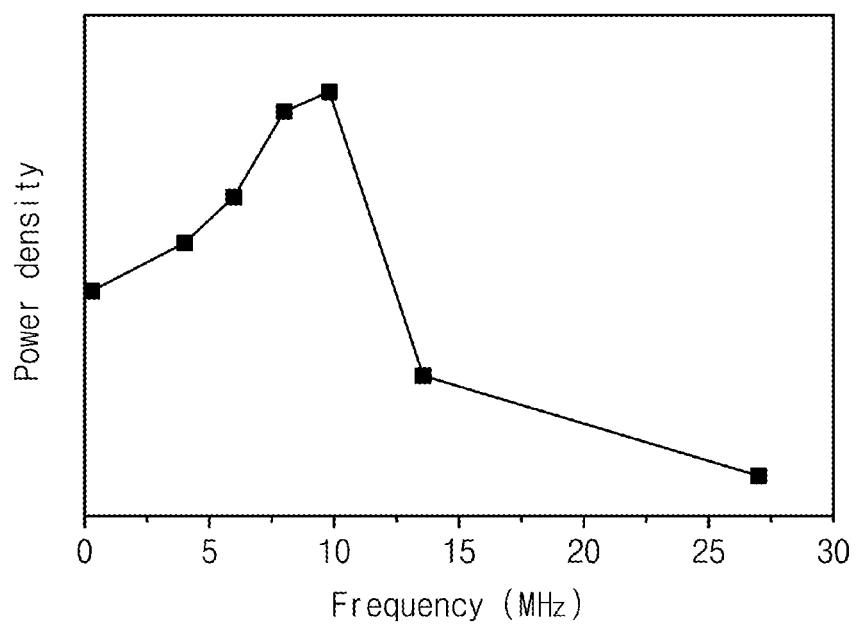
FIG. 32C is a graph showing a power density in accordance with a RF frequency combination.

FIG. 32A illustrates an average ion energy in accordance with a RF frequency combination according to the present inventive concept, and FIG. 32B illustrates an ion flux in accordance with a RF frequency combination according to the present inventive concept. FIG. 32C illustrates a power density in accordance with a RF frequency combination according to inventive concepts. FIGS. 32A to 32C show data obtained by changing the second frequency under a condition that the first and third frequencies are fixed. In FIGS. 32A to 32C, the data may be obtained when the first and third frequencies are respectively fixed to about 60 MHz and 400 kHz, and the second frequency is changed to about 100 kMz, 4 MHz, 6 MHz, 8 MHz, 9.8 MHz, 13 MHz, and 27 MHz. The data shown in FIGS. 32A to 32C may be resultantly obtained when the first to third RF powers are respectively controlled to about 2400 W, 2500 W, and 9000 W.

Referring to FIG. 32A, the average ion energy decreases as the second frequency increases. In contrast, as shown in FIG. 32B, the ion flux decreases as the second frequency decreases. It may be conclusively found that the average ion energy is in a trade-off relation with the ion flux. Referring to FIG. 32C, it may be ascertained that the power density is greater when the second frequency is in the range of about 100 kHz to about 10 MHz than in the range of more than about 10 MHz. For example, it may be recognized that the power density exhibits a peak when the second RF power has a frequency of about 9.8 MHz.

Figure 33A:
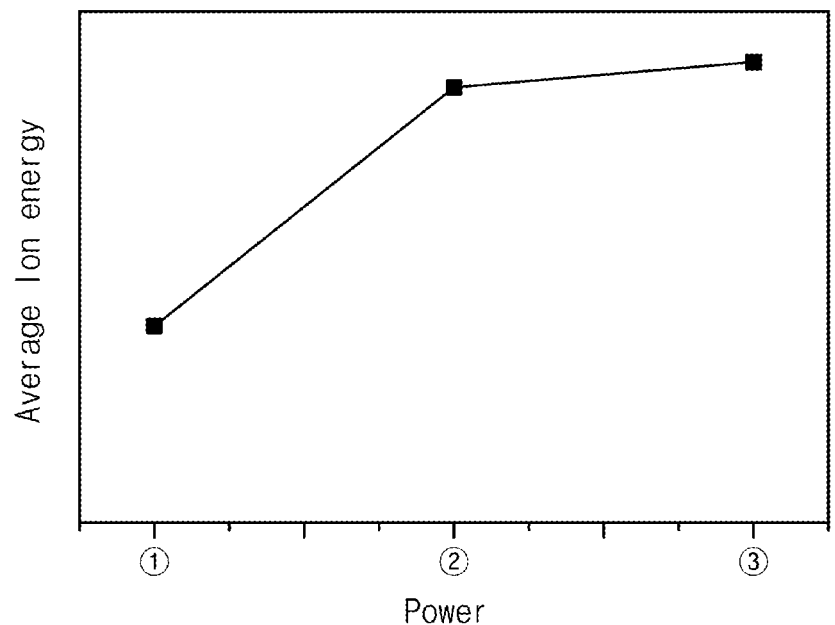
FIG. 33A is a graph showing an average ion energy in accordance with a RF power combination.
Figure 33B:
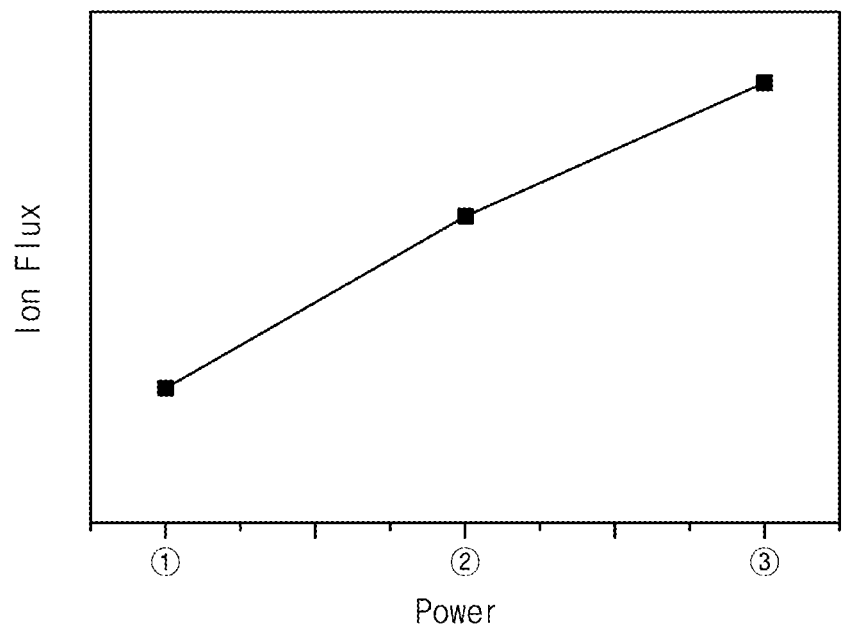
FIG. 33B is a graph showing an ion flux in accordance with a RF power combination.
Figure 33C:
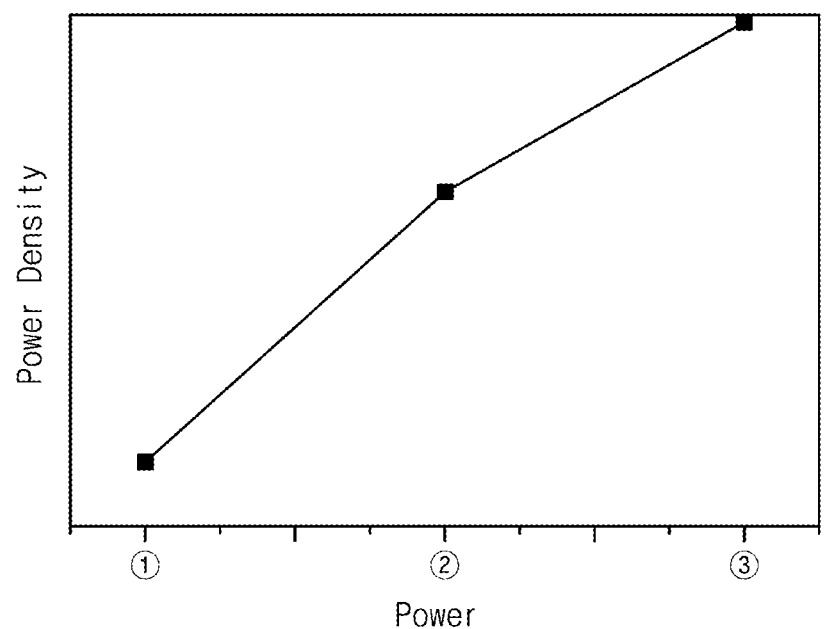
FIG. 33C is a graph showing a power density in accordance with a RF power combination.

FIG. 33A illustrates an average ion energy in accordance with a RF power combination according to inventive concepts, and FIG. 33B illustrates an ion flux in accordance with a RF power combination according to inventive concepts. FIG. 33C illustrates a power density in accordance with a RF power combination according to inventive concepts. In FIGS. 33A to 33C, a symbol of ①a may denote that the first to third RF powers are about 2400 W, 2500 W, and 5000 W, respectively; a symbol of ② may indicate that the first to third RF powers are about 5000 W, 5000 W, and 50000 W, respectively; and a symbol of ③ may express that the first to third RF powers are about 10000 W, 10000 W, and 50000 W, respectively. FIGS. 33A to 33C show data obtained under the same frequency combination and process environment. For example, the first to third frequencies are about 60 MHz, 9.8 MHz, and 400 kHz, respectively. Referring to FIGS. 33A to 33C, it may be found that the average ion energy, the ion flux, and the power density become greater as the RF powers become larger. An increase of the RF powers may accelerate enhancement of etching rate. FIGS. 33A to 33C each exemplarily explain an example that the first to third RF powers are applied at the same time; alternatively, as discussed below, the first to third RF powers may be controlled to have a pulse mode or a synchronize mode of turn-on/off.

Figure 34:
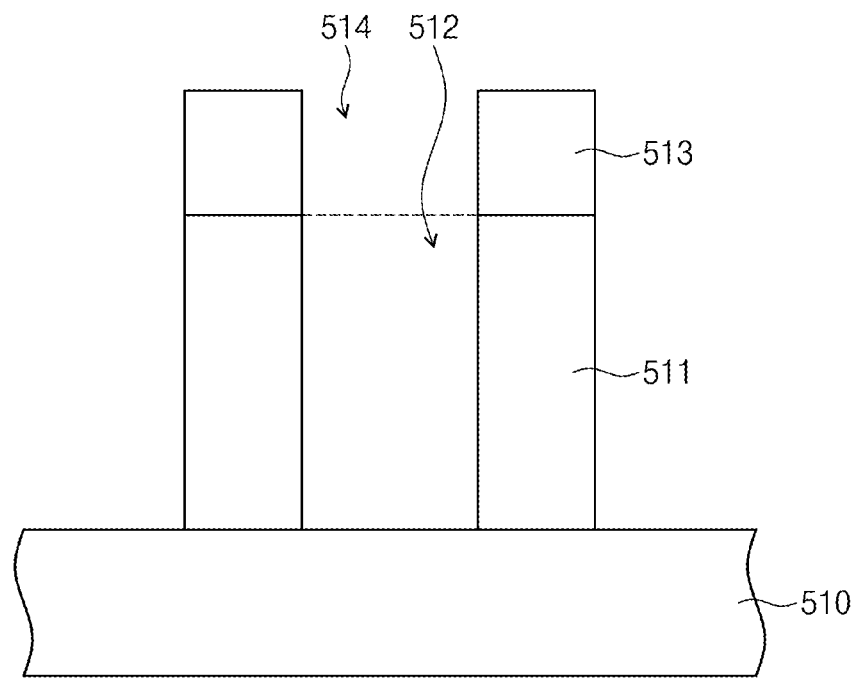
FIG. 34 is a cross-sectional view of an etching target that has been etched using a frequency combination according to some example embodiments of inventive concepts.
Figure 35:
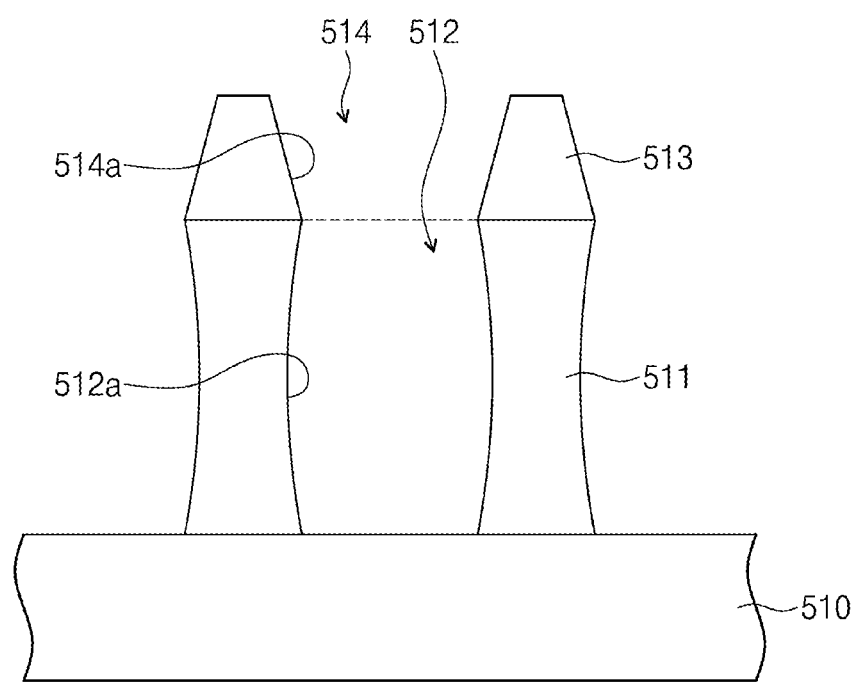
FIG. 35 is a cross-sectional view of an etching target that has been etched using a frequency combination according to a comparative example.

FIG. 34 is a cross-sectional view of an etching target that has been etched using a RF frequency combination according to some example embodiments of inventive concepts, and FIG. 35 is a cross-sectional view of an etching target that has been etched using a RF frequency combination according to a comparative example. FIGS. 34 and 35 illustrate the mask 513, the etching target 511, and the substrate 510, each of which shape and ratio may be different from actual shape and ratio; for example, the shape and ratio may be exaggerated for simplicity of the description.

In FIG. 34 according to some example embodiments of inventive concepts, the RF frequency combination may be achieved when the first to third frequencies are about 60 MHz, 9.8 MHz, and 400 kHz, respectively. In FIG. 35 according to a comparative example, the RF frequency combination may be achieved when the first to third frequencies are about 60 MHz, 13.56 MHz, and 400 kHz, respectively.

Referring to FIG. 34, when the RF frequency combination according to some example embodiments of inventive concepts is employed, it may be ascertained that the etching target 511 is anisotropically etched in accordance with the mask opening 514 of the mask 513. In other words, the etching target 511 may be etched on its portion exposed through the mask opening 514 such that the etched opening 512 may be formed. In this case, the etched opening 512 may have an aspect ratio in the range from about 20:1 to about 100:1.

In contrast, referring to FIG. 35, when the RF frequency combination according to a comparative example is employed, it may be found that the mask 513 is also etched. In more detail, the mask opening 514 may be etched on its inner sidewalls 514a to make the mask opening 514 wide, and cations colliding with the inner sidewalls 514a of the mask opening 514 may be incident onto the etching target 511. Accordingly, the inner sidewalls 512a of the etched opening 512 may be additionally etched such that it may occur a bowing phenomenon where the etching target 511 is recessed toward its central axis. As such, a shape and size of the etched opening 512 may be differently changed, and a pattern failure may occur on the etching target 511.

As discussed above, the RF frequency combination according to some example embodiments of inventive concepts may increase the ion energy while reducing and/or minimizing decrease of the ion flux. It thus may be possible to form the etched opening having a high aspect ratio in a HARC (high aspect ratio contact) etching process and to prevent the etching target 511 from pattern failures such as a bowing phenomenon.

Referring back to FIG. 30, a matcher 300 may be disposed between the RF power supply unit 200 and the chamber 100. The matcher 300 may reduce or minimize loss of the RF powers generated from the RF power supply unit 200. It therefore may be obtained an increased transfer efficiency of the RF powers provided from the RF power supply unit 200 to the first electrode 110. The matcher 300 may be provided in plural to correspond to the number of the RF power supplies 260, 270, and 280, and the plurality of matchers 300 may be connected to corresponding RF power supplies 260, 270, and 280. The plurality of matchers are omitted for simplicity of the drawings. The matcher 300 may be integrated with a controller 400 to constitute a single unitary body.

The controller 400 may be connected to the RF power supply unit 200 and the matcher 300. The controller 400 may provide control signals to the first to third RF power supplies 260 to 280 to control each thereof. The control signal may include a pulsed signal and information about phase of the pulsed signal. The pulsed signal may have a predetermined frequency and duty ratio. For example, the controller 400 may control turns-on or turns-off of the first to third RF powers respectively produced from the first to third RF power supplies 260 to 280. The first to third RF powers may thus be pulse-modulated by the pulse signal. Alternatively, in other example embodiments, the controller 400 may not control to pulse modulate the first to third RF powers.

FIGS. 36A to 36D are timing diagrams showing turn-on/off durations of powers applied to a first electrode when a plasma etching process is performed using the plasma etching apparatus 20 of FIG. 30.

Figure 36A:
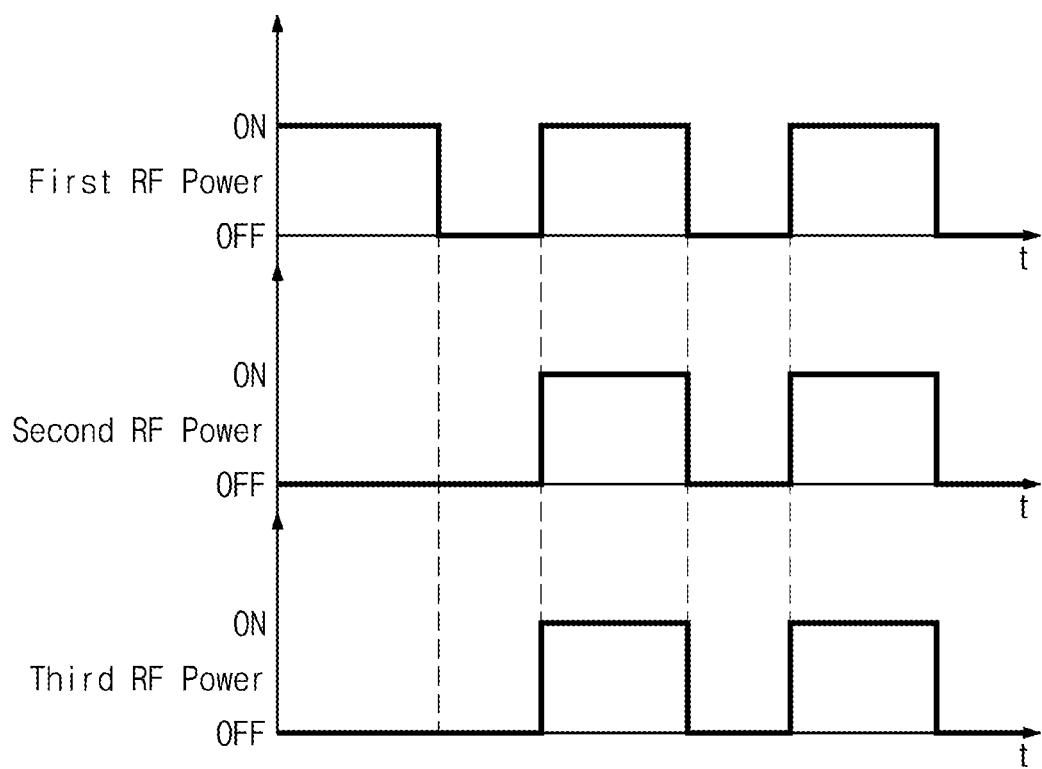
FIGS. 36A to 36D are timing diagrams showing turn-on/off durations of power applied to a first electrode when a plasma etching process is performed using the plasma etching apparatus of FIG. 30.

As shown in FIG. 36A, when a plasma etching process is performed, the first RF power may be applied in advance, and then the second and third RF powers may be applied. The first RF power, or the source RF power, may be applied to create an environment for producing plasma at the initial stage of the plasma etching process, and then the second and third RF powers, or bias RF powers, may be applied. As the second and third RF powers have frequencies relatively less than that of the first RF power, it may be preferable that the first RF power is applied in advance to prevent instability due to high ion energy caused by the second and third RF powers. In other example embodiments, after the first RF power is first applied, only one of the second and third RF powers may be applied.

The pulsed signal may have a frequency of, but not limited to, about 500 Hz to about 20 kHz. The pulsed signal may have a duty ratio of, but not limited to, about 20% to about 80%. Accordingly, the first to third RF powers may be pulse-modulated at approximately 1 kHz. The pulse-modulated RF powers may have a duty ratio of about 50%. The pulse modulation of the RF powers may be synchronized with each other. In some example embodiments, the first to third RF powers may be turned on and/or turned off at the same time.

Figure 36B:
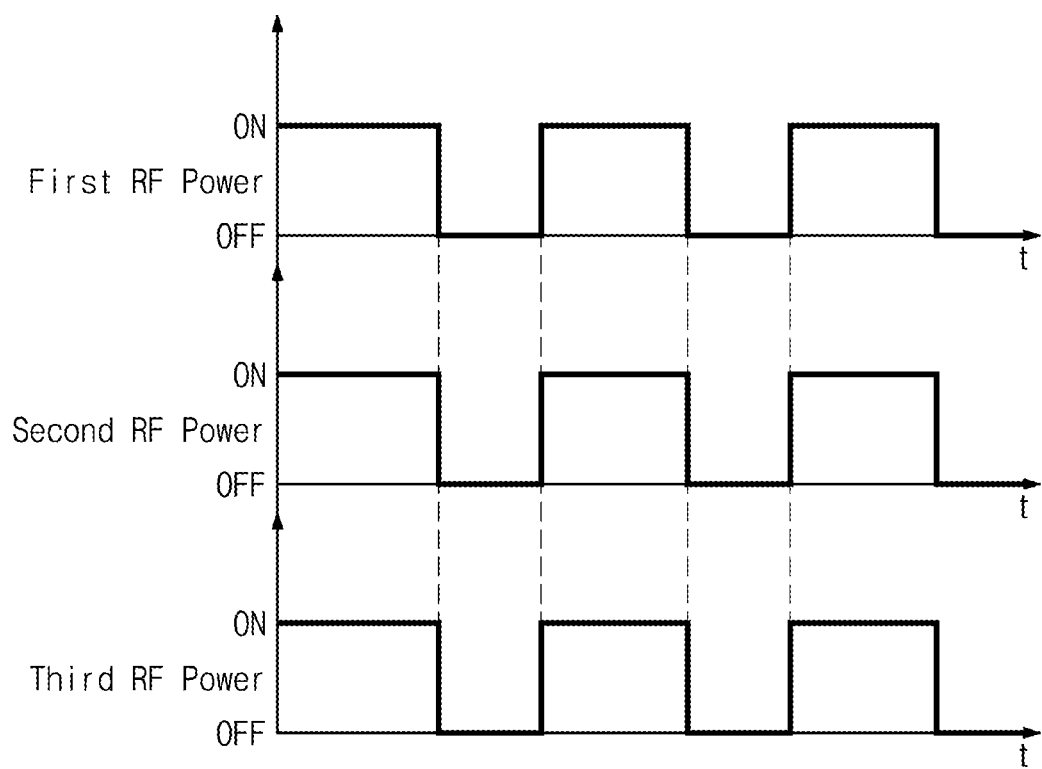

As shown in FIG. 36B, the first to third RF powers may be applied at the same time during the plasma etching process. For example, the second and third RF powers may be turned on in synchronization when the first RF power is turned on. Likewise, the second and third RF powers may be turned off in synchronization when the first RF power is turned off. Accordingly, the first to third RF powers may have the same duty ratio. In other example embodiments, at least one of the second and third RF powers may be turned off differently from the first RF power.

Figure 36C:
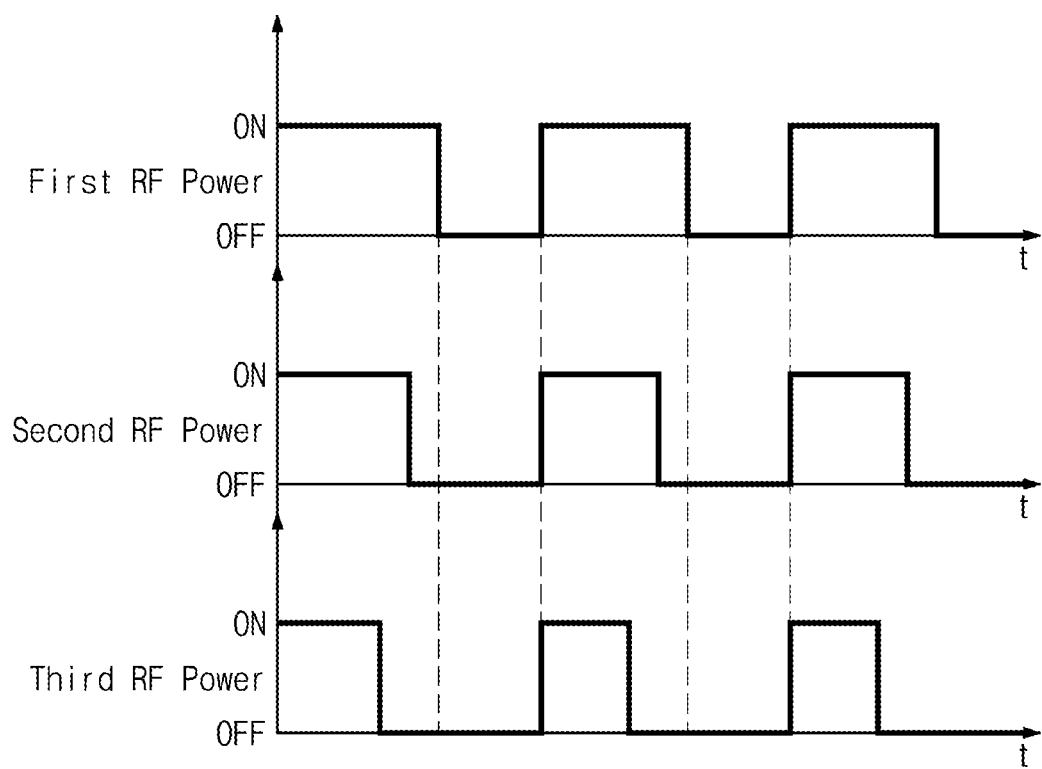

As shown in FIG. 36C, during the plasma etching process, the second and third RF powers may be turned on in synchronization when the first RF power is turned on. The second and third RF powers may be turned off before the first RF power is turned off, and the third RF power may be turned off before the second RF power is turned off. In other words, at least one of the first to third RF powers may have a duty ratio different from those of the others.

Figure 36D:
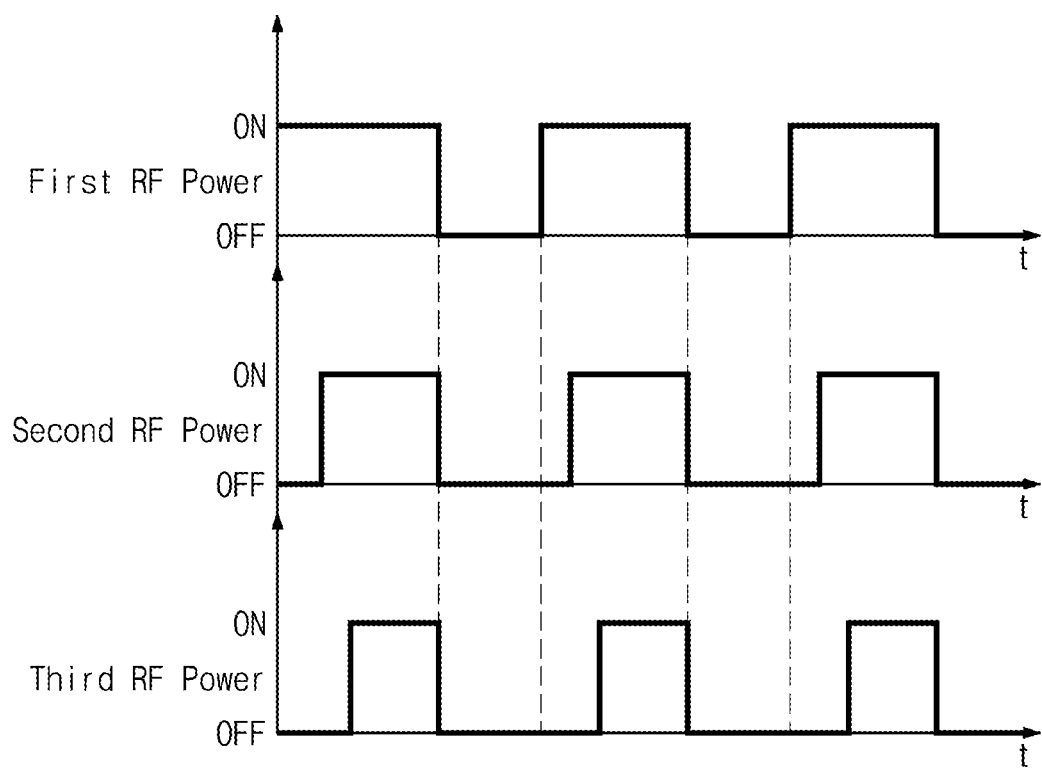

As shown in FIG. 36D, during the plasma etching process, the second and third RF powers may be sequentially turned on after the first RF power is turned on. For example, the second RF power may be turned on after the first RF power is turned on, and then the third RF power may be turned on after the second RF power is turned on. The first to third RF powers may be turned off at the same time. In other words, at least one of the first to third RF powers may have a duty ratio different from those of the others.

The first to third RF powers may be pulse-modulated in synchronization with each other. In some example embodiments, the first to third RF powers may be pulse-modulated to turn on and/or turn off at the same time.

Figure 37:
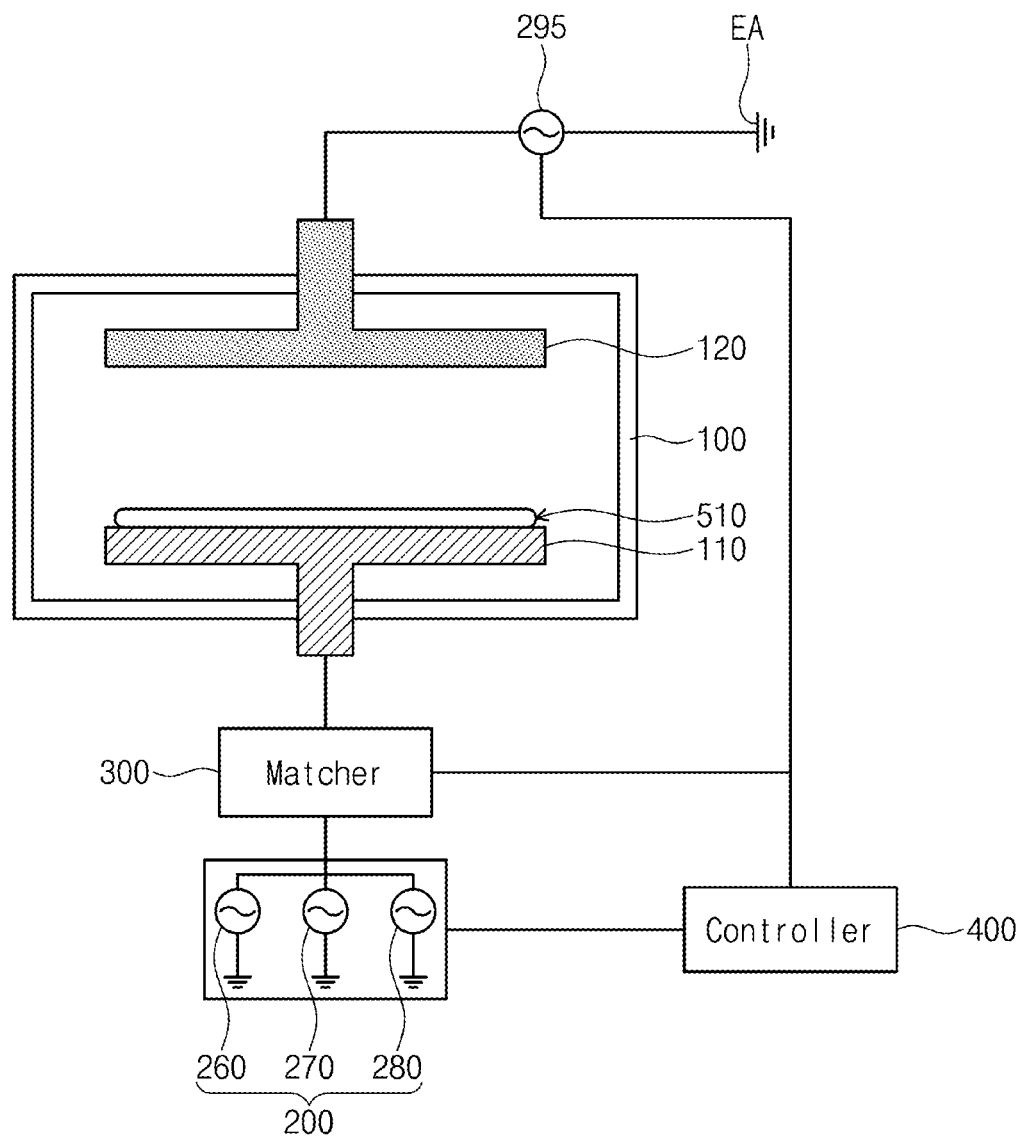
FIG. 37 is a schematic diagram illustrating a plasma etching apparatus according to some example embodiments of inventive concepts.

FIG. 37 is a schematic diagram illustrating a plasma etching apparatus 21 according to some example embodiments of inventive concepts. In the embodiment that follows, component substantially the same as those of the plasma etching apparatus 20 discussed with reference to FIG. 30 are allocated the same reference numerals thereto, and a repetitive explanation thereof will be omitted in the interest of brevity of the description.

Referring to FIG. 37, the plasma etching apparatus 21 may further include an upper RF power supply unit 295. The upper RF power supply unit 295 may be connected to the second electrode 120, for example, an upper electrode. But the present inventive concept is not limited hereto, for example, the RF power supply unit 200 may apply a plurality of RF powers to one of the first electrode 110 (e.g., the lower electrode) and the second electrode 120 (e.g., the upper electrode), and the upper RF power supply unit 295 may be connected to the other one of the first electrode 110 and the second electrode 120. The upper RF power supply unit 295 may have a frequency in the range from about 0 MHz to about 100 MHz. For example, the upper RF power supply unit 295 may have a frequency of about 60 MHz.

The controller 400 may be connected to the RF power supply unit 200 (also hereinafter referred to as the lower RF power supply unit) and the upper RF power supply unit 295. The controller 400 may provide control signals to the lower and upper RF power supply units 200 and 295 to control the upper RF power supply unit 295 and the first to third RF power supplies 260 to 280 independently of each other. For example, the controller 400 may control turns-on or turns-off of the first to third RF powers respectively produced from the first to third RF power supplies 260 to 280. The controller 400 may control turn-on or turn-off of a direct current power produced from the upper RF power supply unit 295.

Figure 38:
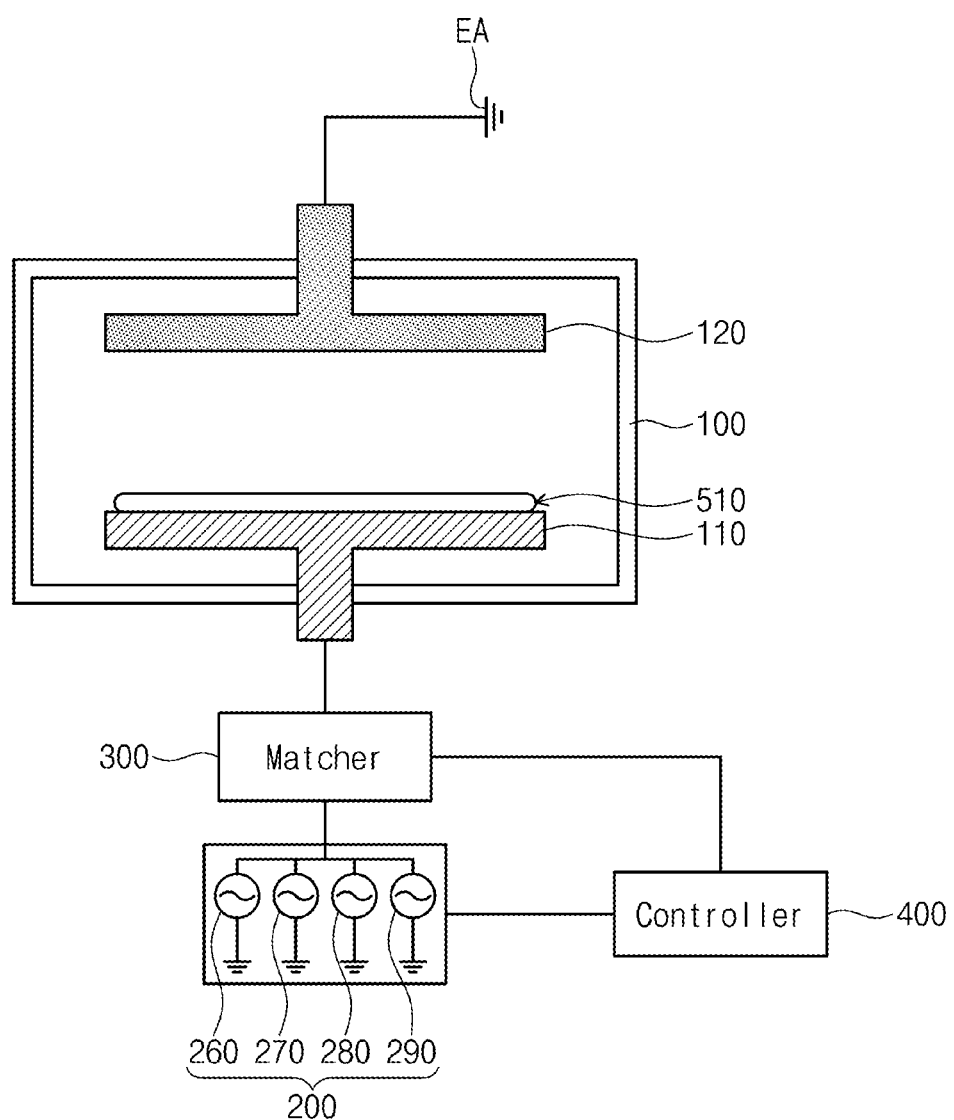
FIG. 38 is a schematic diagram illustrating a plasma etching apparatus according to some example embodiments of inventive concepts.

FIG. 38 is a schematic diagram illustrating a plasma etching apparatus 22 according to some example embodiments of inventive concepts. In the embodiment that follows, component substantially the same as those of the plasma etching apparatus 20 discussed with reference to FIG. 30 are allocated the same reference numerals thereto, and a repetitive explanation thereof will be omitted in the interest of brevity of the description.

Referring to FIG. 38, a fourth RF power supply 290 may further be included in the RF power supply unit 200 of the plasma etching apparatus 22. The RF power supply unit 200 may apply a plurality of RF powers to one of the first electrode 110 and the second electrode 120. The fourth RF power supply 290 may produce a fourth RF power having a fourth frequency. The fourth frequency may be in the range from about 100 kHz to about 5 MHz. The fourth frequency may be selected in the range greater than the third frequency and less than the second frequency. In some example embodiments, the first to fourth frequencies may be about 60 MHz, 9.8 MHz, 400 kHz, and 2 MHz, respectively.

The controller 400 may be connected to the matcher 300 and the RF power supply unit 200. The controller 400 may provide control signals to the RF power supply unit 200 such that the first to fourth RF power supplies 260 to 290 may be controlled independently of each other. For example, the controller 400 may control turns-on or turns-off of the first to fourth RF powers respectively produced from the first to fourth RF power supplies 260 to 290.

One of the plasma etching apparatuses 20, 21, and 22 respectively shown in FIGS. 30, 37, and 38 may be employed to perform the method of fabricating the semiconductor device discussed with reference to FIGS. 13 to 18 and the method of fabricating the semiconductor device discussed with reference to FIGS. 19 to 29.

According to example embodiments of inventive concepts, a RF frequency combination may be provided to increase an ion energy while reducing and/or minimizing decrease of the ion flux.

In a method of plasma etching and a method of fabricating a semiconductor device using the same according to some example embodiments of inventive concepts, it may be possible to effectively reduce failure, occurred when an etched pattern is formed to have a high aspect ratio, by adjusting an ion energy distribution of ions incident toward an etching target on a substrate.

For ease of description, example embodiments have been described for plasma etching applications, but example embodiments are not limited thereto. One of ordinary skill in the art would appreciate that inventive concepts may be applied to other semiconductor processes such as plasma clean, plasma deposition, and the like in the plasma etching apparatuses of FIGS. 1, 11, 30, 37, and 38 and/or modifications thereof, or other apparatuses.

Effects of inventive concepts is not limited to the above-mentioned one, other effects which have not been mentioned above will be clearly understood to those skilled in the art from the description above.

Although some example embodiments of inventive concepts have been described, it will be understood by one of ordinary skill in the art that variations in form and detail may be made therein without departing from the spirit and scope of inventive concepts. The above disclosed embodiments should thus be considered illustrative and not restrictive.

What is claimed is:

1. A method of plasma etching, the method comprising:
   loading a substrate in a chamber, the substrate including an etching target, the chamber including a first electrode and a second electrode facing each other; and
   etching the etching target, the etching the etching target including applying a plurality of RF powers to the first electrode,
   wherein applying the plurality of RF powers comprises:
   applying a first RF power having a first frequency in a range from about 40 MHz to about 300 MHz, the first RF power pulsed to have a pulse frequency of 1 kHz;
   applying a second RF power having a second frequency in a range from about 100 kHz to about 10 MHz, the second RF power pulsed to have the pulse frequency of 1 kHz; and
   applying a third RF power having a third frequency in a range from about 10 kHz to about 5 MHz, a value of the third frequency being less than a value of the second frequency, the third RF power pulsed to have the pulse frequency of 1 kHz, the third RF power being greater than at least one of the first RF power and the second RF power,
   wherein the second RF power and the third RF power are simultaneously pulsed to equalize an ion energy, with the initial application of the second and third RF powers occurring at least one cycle of the first RF power to stabilize the ion energy.

2. The method of claim 1, wherein the first frequency is about 60 MHz, the second frequency is about 9.8 MHz, and the third frequency is about 400 kHz.

3. The method of claim 2, wherein
   the first electrode is a lower electrode,
   the loading the substrate includes loading the substrate onto the first electrode,
   the second electrode is an upper electrode.

4. The method of claim 3, wherein the etching the etching target includes applying the first to third RF powers to the lower electrode at the same time.

5. The method of claim 3, wherein
   the third RF power is greater than the first RF power, and
   the third RF power is greater than the second RF power.

6. The method of claim 5, wherein the first RF power is in a range from about 0 W to about 10000 W, the second RF power is in a range from about 0 W to about 10000 W, and the third RF power is in a range from about 0 W to about 50000 W.

7. The method of claim 3, wherein
   the etching the etching target includes supplying the upper electrode with an upper RF power, and
   the upper RF power has a frequency in a range from about 0 MHz to about 100 MHz.

8. A method of plasma etching, the method comprising:
   loading a substrate in a chamber, the substrate including an etching target, the chamber including a first electrode and a second electrode facing each other; and
   etching the etching target, the etching the etching target including applying a plurality of RF powers to the first electrode,
   wherein applying the plurality of RF powers comprises:
   applying a first RF power having a first frequency in a range from about 40 MHz to about 300 MHz, the first RF power pulsed to have a pulse frequency of 1 kHz;
   applying a second RF power having a second frequency in a range from about 100 kHz to about 10 MHz, the second RF power pulsed to have the pulse frequency of 1 kHz;
   applying a third RF power having a third frequency in a range from about 10 kHz to about 5 MHz, a value of the third frequency being less than a value of the second frequency, the third RF power pulsed to have the pulse frequency of 1 kHz; and a fourth RF power, wherein the fourth RF power has a fourth frequency that is greater than the third frequency and less than the second frequency, wherein the second RF power and the third RF power are simultaneously pulsed to equalize an ion energy, with the initial application of the first and second RF powers occurring after at least one cycle of the first RF power to stabilize the ion energy.

9. A method of plasma etching, the method comprising:

loading a substrate on a lower electrode in a chamber, the substrate including an etching target, the chamber including the lower electrode and an upper electrode facing the lower electrode; and generating plasma in the chamber to etch the etching target, the generating the plasma including,
- applying a first source RF power to one of the lower and upper electrodes, and
- after applying the first source RF power, applying a plurality of bias RF powers to the one of the upper and the lower electrode, the plurality of bias RF powers including
- a first bias RF power having a frequency of about 9.8 MHz and a pulse frequency of 1 kHz,
- a second bias RF power having a frequency of about 400 kHz and a pulse frequency of 1 kHz, and
- a third bias RF power having a frequency of about 60 MHz and a pulse frequency of 1 kHz,
- wherein the second RF bias power is simultaneously pulsed with the first RF bias power, with the initial application of the first and second RF powers occurring after at least one full cycle of the third RF power.

* * * * *